(12) United States Patent
Lin et al.

(10) Patent No.: US 12,170,321 B2
(45) Date of Patent: Dec. 17, 2024

(54) FIN FIELD EFFECT TRANSISTOR HAVING CONFORMAL AND NON-CONFORMAL GATE DIELECTRIC LAYERS

(71) Applicant: Taiwan Semiconductor Manufacturing Co., Ltd., Hsinchu (TW)

(72) Inventors: Kuei-Lun Lin, Keelung (TW); Yen-Fu Chen, Hsinchu (TW); Po-Ting Lin, Hsinchu (TW); Chia-Yuan Chang, Hsinchu (TW); Xiong-Fei Yu, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 828 days.

(21) Appl. No.: 17/018,031

(22) Filed: Sep. 11, 2020

(65) Prior Publication Data

US 2021/0126101 A1    Apr. 29, 2021

Related U.S. Application Data

(60) Provisional application No. 62/927,330, filed on Oct. 29, 2019.

(51) Int. Cl.
| | | |
|---|---|---|
| H01L 29/423 | (2006.01) | |
| H01L 21/28 | (2006.01) | |
| H01L 21/8234 | (2006.01) | |
| H01L 21/8238 | (2006.01) | |
| H01L 27/092 | (2006.01) | |
| H01L 29/66 | (2006.01) | |
| H01L 29/78 | (2006.01) | |
| H01L 29/51 | (2006.01) | |

(52) U.S. Cl.
CPC .. *H01L 29/42368* (2013.01); *H01L 21/28194* (2013.01); *H01L 21/823431* (2013.01); *H01L 21/823462* (2013.01); *H01L 21/823821* (2013.01); *H01L 21/823857* (2013.01); *H01L 27/0924* (2013.01); *H01L 29/66545* (2013.01); *H01L 29/66795* (2013.01); *H01L 29/7851* (2013.01); *H01L 29/7856* (2013.01); *H01L 29/513* (2013.01)

(58) Field of Classification Search
CPC ............ H01L 29/12368; H01L 29/513; H01L 29/517; H01L 29/66795; H01L 29/7851; H01L 29/7856; H01L 21/28194; H01L 21/823431; H01L 21/823821; H01L 21/823462; H01L 21/823857; H01L 27/0924; H01L 29/42368; H01L 29/66545
See application file for complete search history.

(56) References Cited

U.S. PATENT DOCUMENTS

| | | | |
|---|---|---|---|
| 2010/0109057 A1* | 5/2010 | Kang | H01L 29/7854 257/E21.409 |
| 2015/0041913 A1* | 2/2015 | An | H01L 27/0924 257/407 |
| 2018/0286761 A1* | 10/2018 | Guo | H01L 29/4983 |

* cited by examiner

*Primary Examiner* — Marcos D. Pizarro
(74) *Attorney, Agent, or Firm* — Slater Matsil, LLP

(57) ABSTRACT

A semiconductor device a method of forming the same are provided. The method includes forming a fin extending from a substrate and forming a gate dielectric layer along a top surface and sidewalls of the fin. A first thickness of the gate dielectric layer along the top surface of the fin is greater than a second thickness of the gate dielectric layer along the sidewalls of the fin.

20 Claims, 27 Drawing Sheets

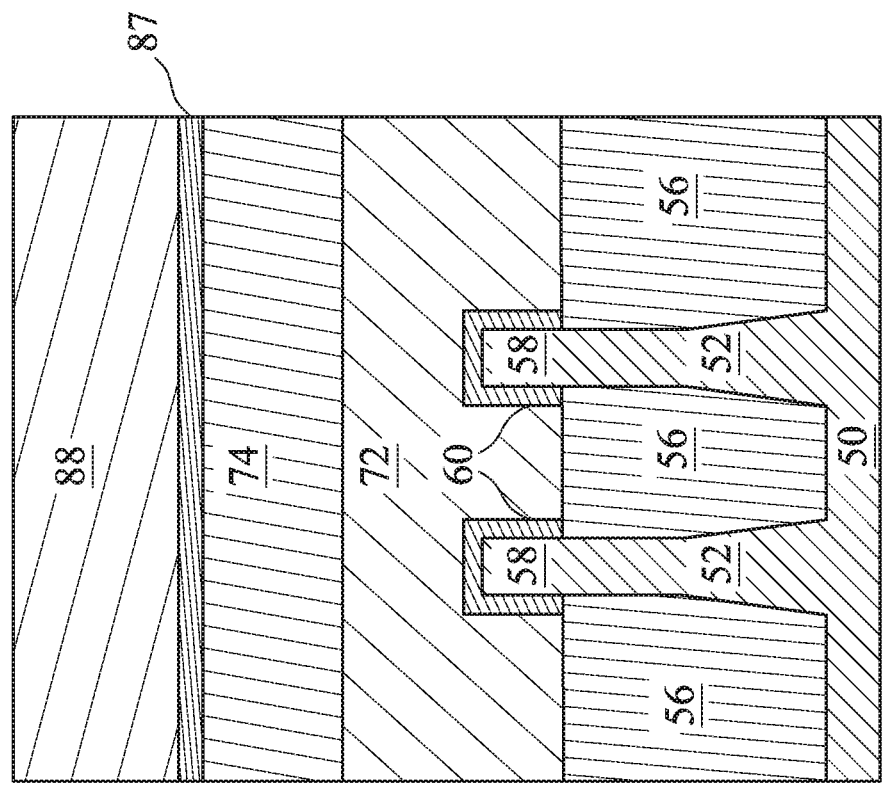
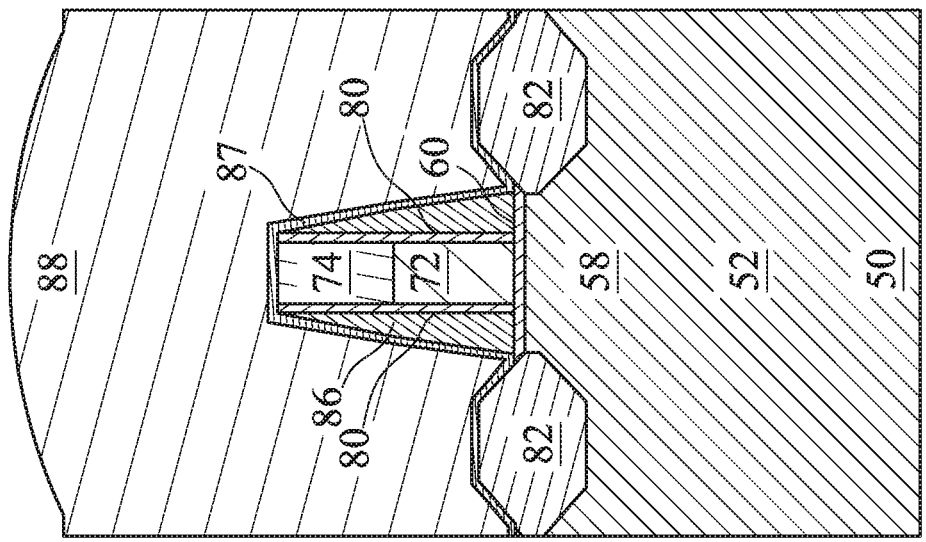
Figure 11A
Figure 11B

FIN FIELD EFFECT TRANSISTOR HAVING CONFORMAL AND NON-CONFORMAL GATE DIELECTRIC LAYERS

PRIORITY CLAIM AND CROSS-REFERENCE

This application claims the benefit of U.S. Provisional Application No. 62/927,330, filed on Oct. 29, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, and 16B are cross-sectional views of intermediate stages in the manufacturing of a FinFET device in accordance with some embodiments.

DETAILED DESCRIPTION

Figure 1:
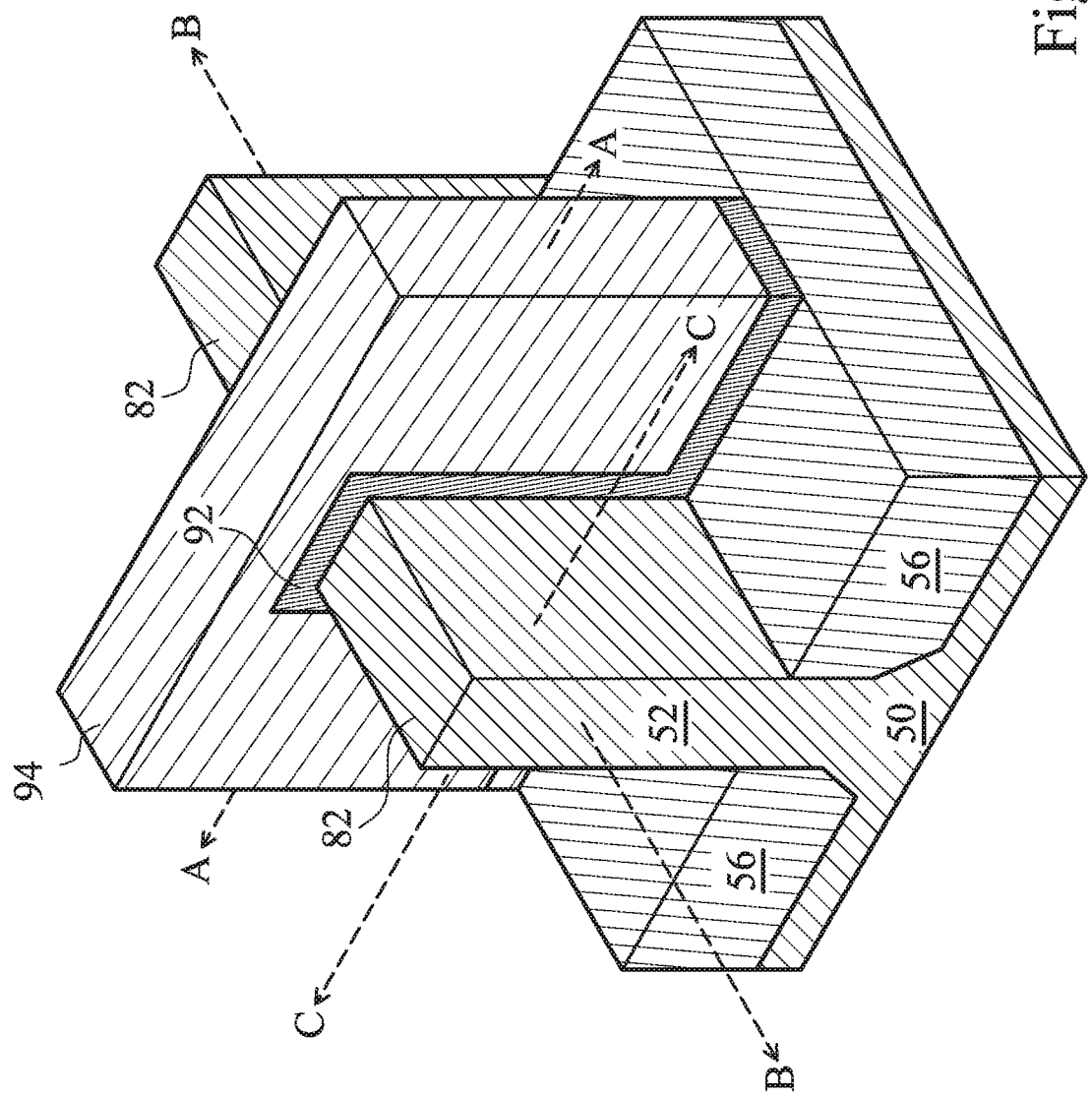
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a gate structure of a semiconductor device and a method of forming the same. Various embodiments presented herein are discussed in the context of a FinFET device formed using a gate-last process. In other embodiments, a gate-first process may be used. Various embodiments discussed herein allow for forming a gate dielectric layer over a fin such that a thickness of the gate dielectric layer over a top surface of the fin is greater than a thickness of the gate dielectric layer on sidewalls of the fin. In some embodiments, a non-conformal gate dielectric layer is formed by alternating the formation of conformal and non-conformal sub-layers. In other embodiments, a non-conformal gate dielectric layer is formed by forming non-conformal sub-layers. The formation of a thicker gate dielectric layer over the top surface of the fin than on the sidewalls of the fin allows for protecting the fin from one or more etch processes performed on a FinFET device after forming the gate structure. For example, fin damage or intrinsic leakage caused by a post gate dry or wet etching performed on the gate dielectric layer is reduced or avoided. Accordingly, a yield and a reliability of the FinFET device may be improved.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and the gate electrode 94. FIG. 1 further illustrates reference cross-sections that are used in later figures. Cross-section A-A is along a longitudinal axis of the gate electrode 94 and in a direction, for example, perpendicular to a direction of a current flow between the source/drain regions 82 of the FinFET. Cross-section B-B is perpendicular to cross-section A-A and is along a longitudinal axis of the fin 52 and in a direction of, for example, the current flow between the source/drain regions 82 of the FinFET. Cross-section C-C is parallel to cross-section A-A and extends through the source/drain region 82 of the FinFET. Subsequent figures refer to these reference cross-sections for clarity.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, and 16B are cross-sectional views of intermediate stages in the manufacturing of a FinFET device in accordance with some embodiments. FIGS. 2 through 7 illustrate cross-sectional views along the reference cross-section A-A illustrated in FIG. 1, except for multiple fins/FinFETs. FIGS. 8A-16A are illustrated along the reference cross-section A-A illustrated in FIG. 1. FIGS. 8B-16B and 14C are illustrated along the reference cross-section B-B illustrated in FIG. 1, except for multiple fins/FinFETs. FIGS. 10C and 10D are illustrated along the reference cross-section C-C illustrated in FIG. 1, except for multiple fins/FinFETs.

Figure 2:
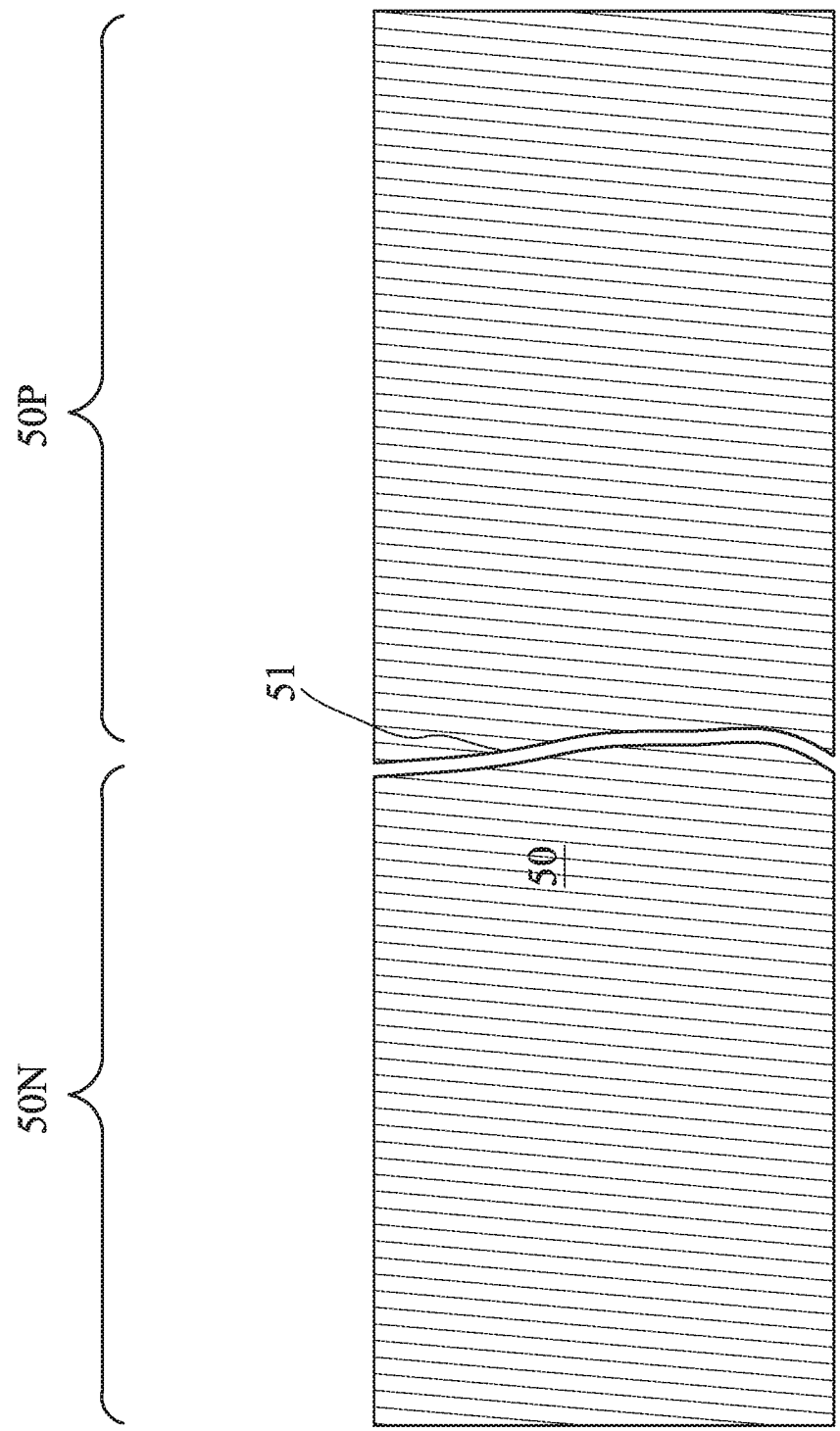

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by a divider 51), and any number of device features (e.g., other active devices, doped regions, isolation structures, etc.) may be disposed between the region 50N and the region 50P.

Figure 3:
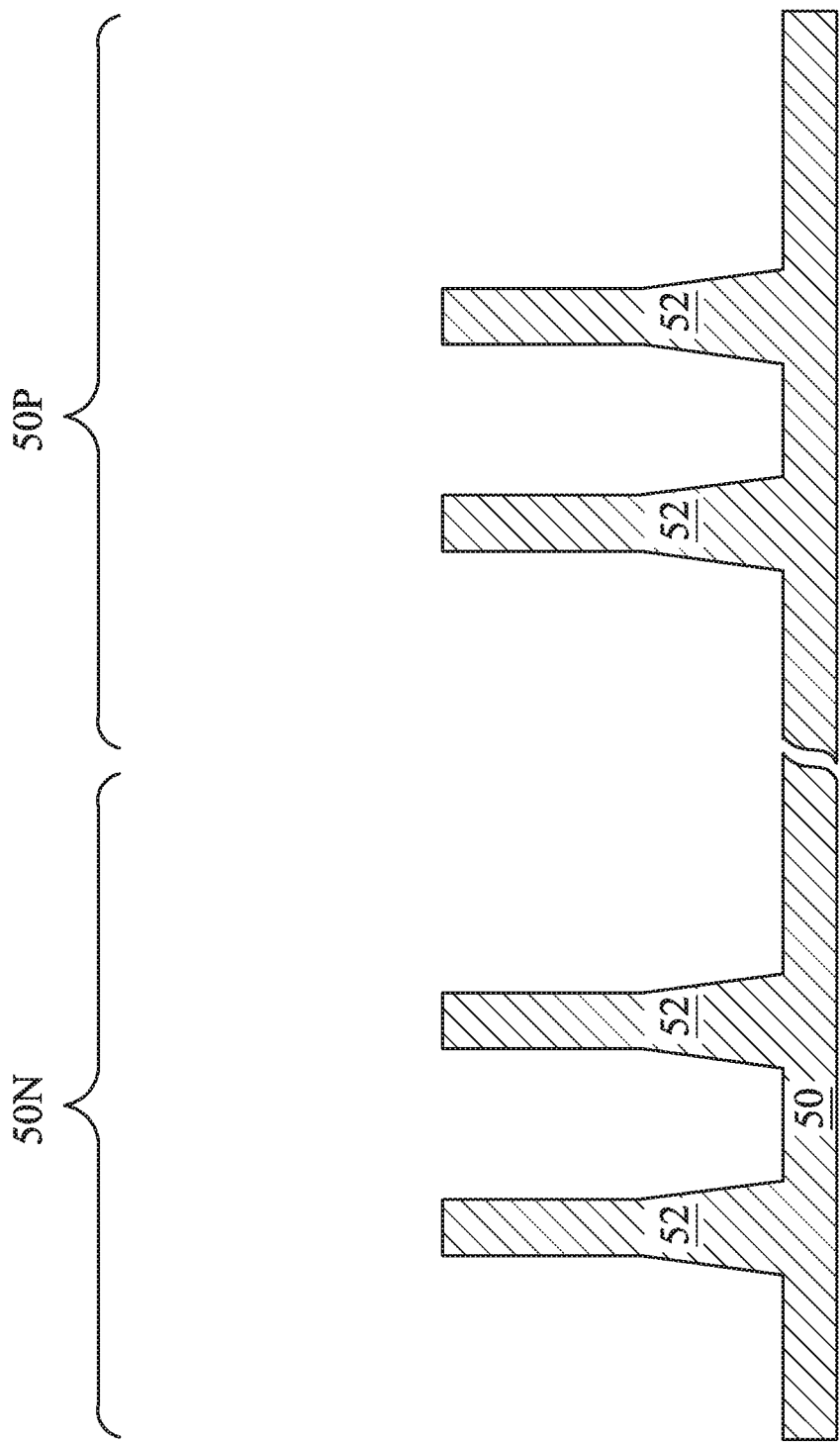

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), a combination thereof, or the like. The etch process may be anisotropic.

The fins may be formed by any suitable method. For example, the fins may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to form the fins.

Figure 4:
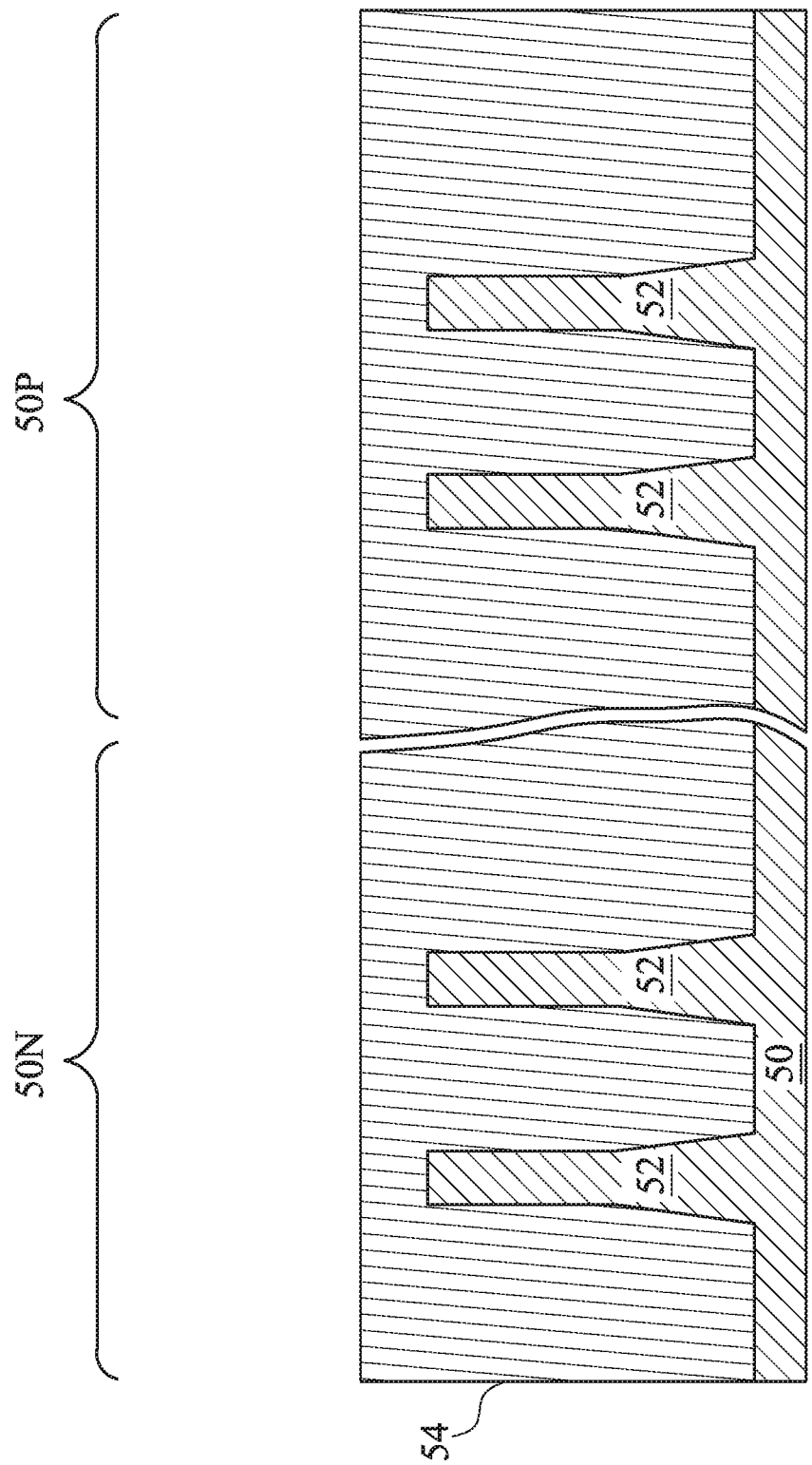

In FIG. 4, an insulation material 54 is formed over the substrate 50 and between neighboring fins 52. The insulation material 54 may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along surfaces of the substrate 50 and the fins 52. Thereafter, a fill material, such as those discussed above may be formed over the liner.

Figure 5:
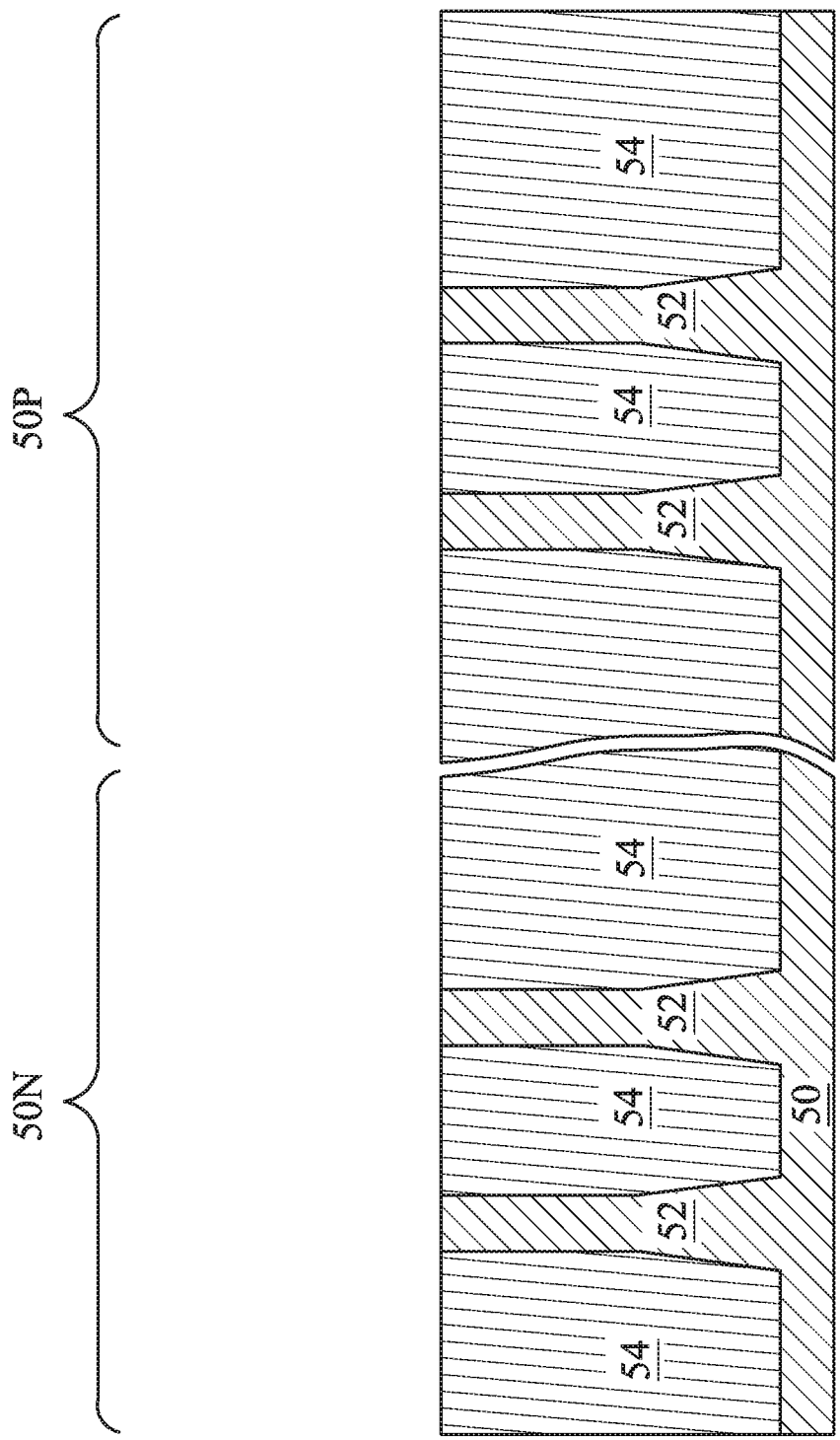

In FIG. 5, a removal process is applied to the insulation material 54 to remove excess portions of the insulation material 54 over the fins 52. In some embodiments, a planarization process, such as a chemical mechanical polish (CMP) process, an etch back process, combinations thereof, or the like, may be utilized. The planarization process exposes the fins 52 such that top surfaces of the fins 52 and the top surface of the insulation material 54 are level after the planarization process is completed.

Figure 6:
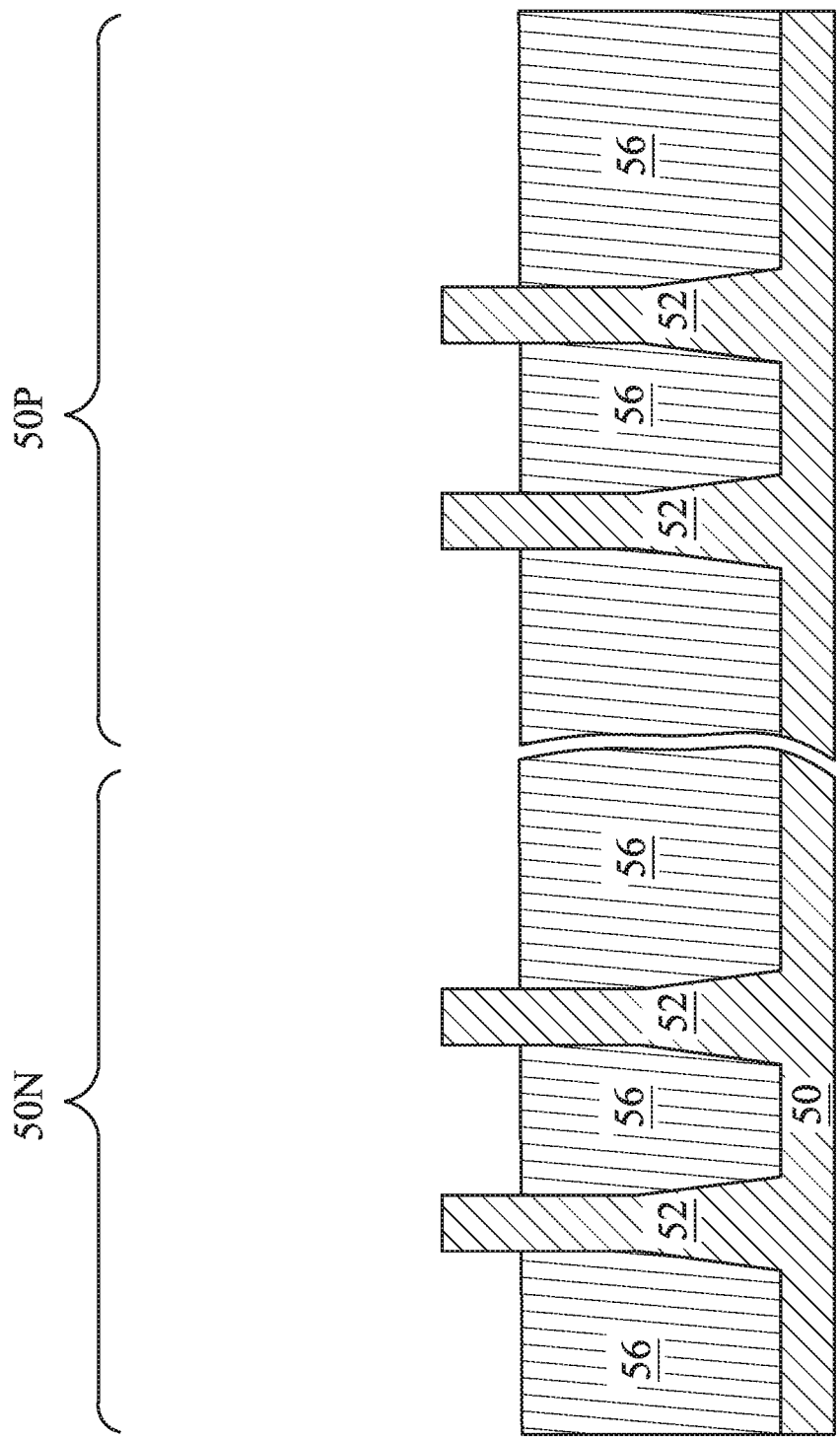

In FIG. 6, the insulation material 54 (see FIG. 5) is recessed to form shallow trench isolation (STI) regions 56. The insulation material 54 is recessed such that upper portions of fins 52 in the regions 50N and 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52 in FIG. 5 can be recessed, and a material different from the fins 52 may be epitaxially grown over the recessed fins 52. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the region 50N different from a material in the region 50P. In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P. In the embodiments with different well types, the different implant steps for the region 50N and the region 50P may be achieved using a photoresist or other masks (not shown). For example, a first photoresist may be formed over the fins 52 and the STI regions 56 in both the region 50N and the region 50P. The first photoresist is patterned to expose the region 50P of the substrate 50. The first photoresist can be formed by using a spin-on technique and can be patterned using acceptable photolithography techniques. Once the first photoresist is patterned, an n-type impurity implantation is performed in the region 50P, while the remaining portion of the first photoresist acts as a mask to substantially prevent n-type impurities from being implanted into the region 50N. The n-type impurities may be phosphorus, arsenic, antimony, or the like, implanted in the region to a dose of equal to or less than $10^{15}$ cm$^{-2}$, such as between about $10^{12}$ cm$^{-2}$ and about $10^{15}$ cm$^{-2}$. In some embodiments, the n-type impurities may be implanted at an implantation energy of about 1 keV to about 10 keV. After the implantation, the first photoresist is removed, such as by an acceptable ashing process followed by a wet clean process.

Following the implantation of the region 50P, a second photoresist is formed over the fins 52 and the STI regions 56 in both the region 50P and the region 50N. The second photoresist is patterned to expose the region 50N of the substrate 50. The second photoresist can be formed by using a spin-on technique and can be patterned using acceptable photolithography techniques. Once the second photoresist is patterned, a p-type impurity implantation may be performed in the region 50N, while the remaining portion of the second photoresist acts as a mask to substantially prevent p-type impurities from being implanted into the region 50P. The p-type impurities may be boron, $BF_2$, indium, or the like, implanted in the region to a dose of equal to or less than $10^{15}$ cm$^{-2}$, such as between about $10^{12}$ cm$^{-2}$ and about $10^{15}$ cm$^{-2}$. In some embodiments, the p-type impurities may be implanted at an implantation energy of about 1 keV to about 10 keV. After the implantation, the second photoresist may be removed, such as by an acceptable ashing process followed by a wet clean process.

After performing the implantations of the region 50N and the region 50P, an anneal process may be performed to activate the p-type and/or n-type impurities that were implanted. In some embodiments, the grown materials of epitaxial fins may be in situ doped during growth, which may obviate the implantations, although in situ doping and implantation doping may be used together.

Figure 7:
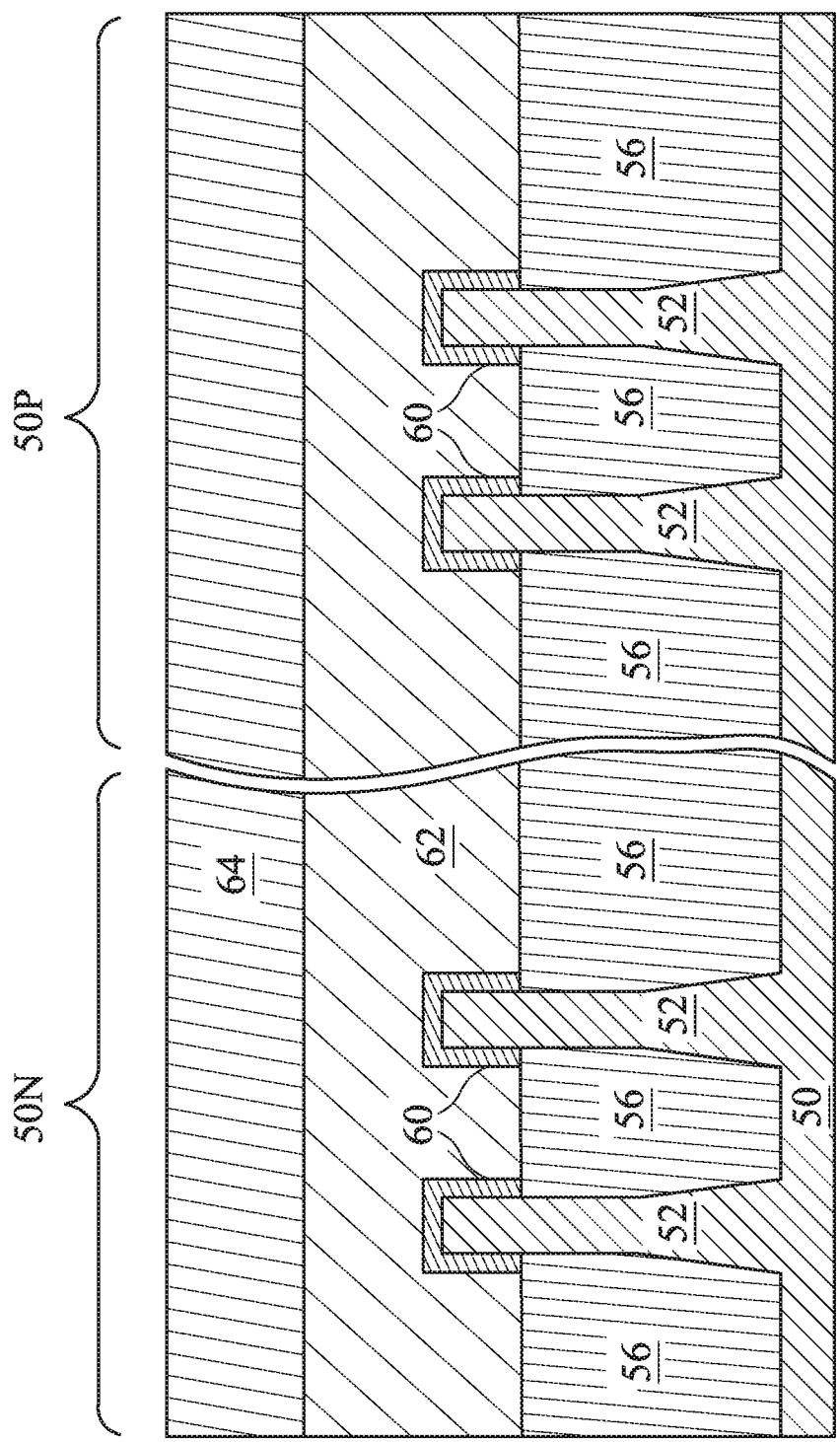

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized using, for example, a CMP process. The mask layer 64 may be deposited over the dummy gate layer 62. The dummy gate layer 62 may be a conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity than materials of the STI regions 56. The mask layer 64 may include, for example, one or more layers of silicon oxide, SiN, SiON, a combination thereof, or the like. In some embodiments, the mask layer 64 may comprise a layer of silicon nitride and a layer of silicon oxide over the layer of silicon nitride. In some embodiments, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A, 8B, 9A, 9B, 10A, 10B, 10C, 10D, 11A, 11B, 12A, 12B, 13A, 13B, 14A, 14B, 14C, 15A, 15B, 16A, and 16B illustrate various additional steps in the manufacturing of a FinFET device in accordance with some embodiments. FIGS. 8A, 8B, 9A, 9B, 10A, 10B, 10C, 10D, 11A, 11B, 12A, 12B, 13A, 13B, 14A, 14B, 14C, 15A, 15B, 16A, and 16B illustrate features in either of the region 50N and the region 50P. For example, the structures illustrated in FIGS. 8A, 8B, 9A, 9B, 10A, 10B, 10C, 10D, 11A, 11B, 12A, 12B, 13A, 13B, 14A, 14B, 14C, 15A, 15B, 16A, and 16B may be applicable to both the region 50N and the region 50P.

Differences (if any) in the structures of the region 50N and the region 50P are described in the text accompanying each figure.

Figure 8B:
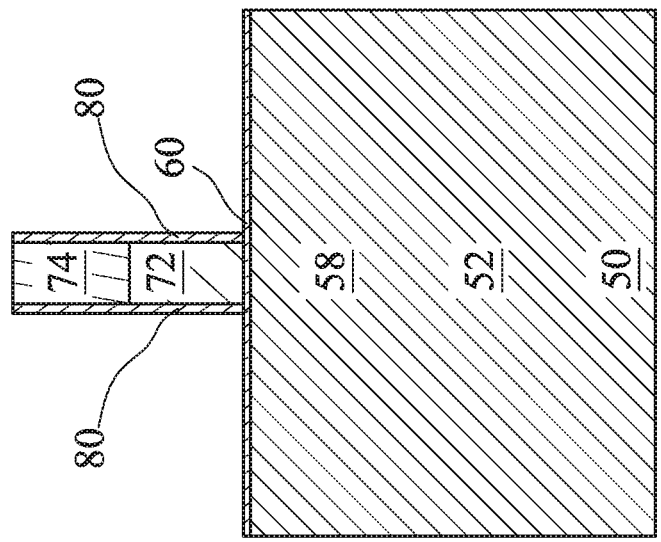
Figure 8A:
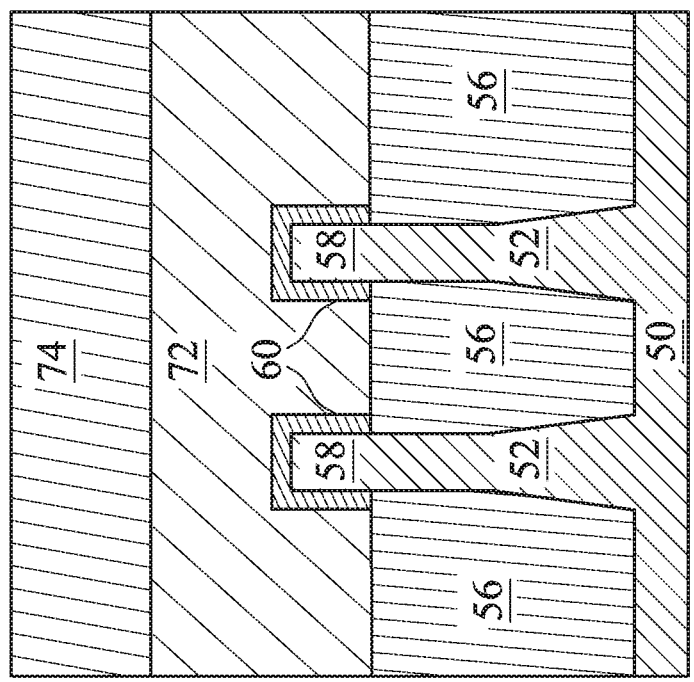

In FIGS. 8A and 8B, the mask layer 64 (see FIG. 7) may be patterned using acceptable photolithography and etching techniques to form masks 74. In some embodiments, the etching techniques may include one or more anisotropic etch processes such as a reactive ion etch (RIE), neutral beam etch (NBE), a combination thereof, or the like. Subsequently, the pattern of the masks 74 may be transferred to the dummy gate layer 62 (see FIG. 7) to form dummy gates 72. In some embodiments, the pattern of the masks 74 may also be transferred to the dummy dielectric layer 60 by an acceptable etching technique. The dummy gates 72 cover channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective one of the fins 52. As described below in greater detail, the dummy gates 72 are sacrificial gates and are subsequently replaced by replacement gates. Accordingly, dummy gates 72 may also be referred to as sacrificial gates. In other embodiments, some of the dummy gates 72 are not replaced and remain in the final structure of the resulting FinFET device.

Further in FIGS. 8A and 8B, gate seal spacers 80 may be formed on exposed surfaces of the dummy gates 72, the masks 74, and/or the fins 52. A thermal oxidation or a deposition followed by an anisotropic etch may form the gate seal spacers 80. The gate seal spacers 80 may comprise silicon oxide, silicon nitride, SiCN, SiOC, SiOCN, a combination thereof, or the like. After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P, while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a dose of impurities of from about $10^{12}$ cm$^{-2}$ to about $10^{16}$ cm$^{-2}$. In some embodiments, the suitable impurities may be implanted at an implantation energy of about 1 keV to about 10 keV. An anneal may be used to activate the implanted impurities.

Figure 9B:
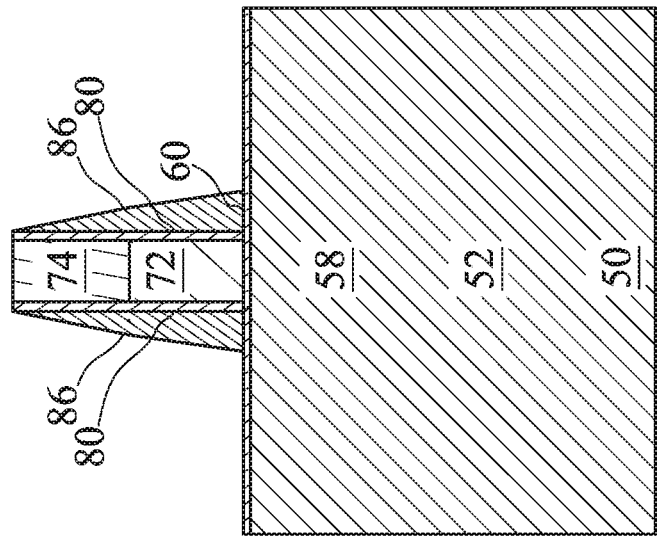
Figure 9A:
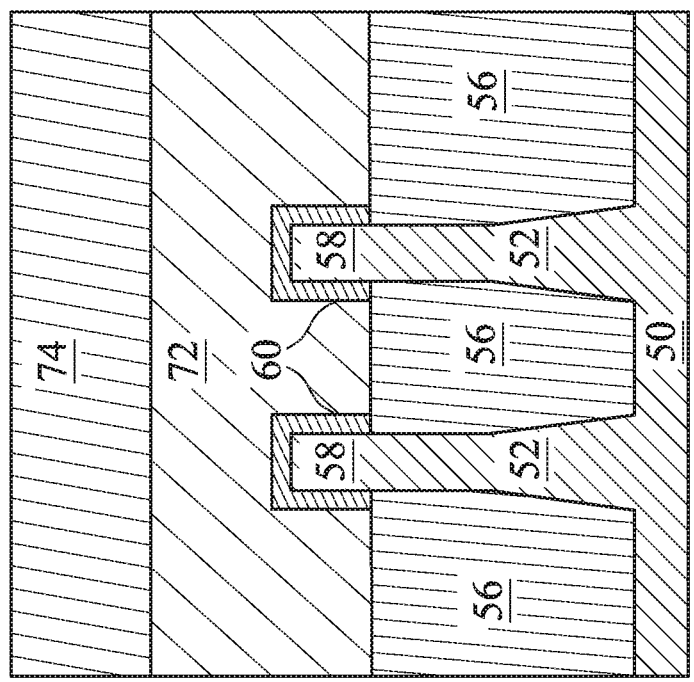

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may comprise silicon oxide, silicon nitride, SiCN, SiOC, SiOCN, a combination thereof, or the like. In some embodiments, the gate spacers 86 may comprise a plurality of layers (not shown), such that the layers comprise different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
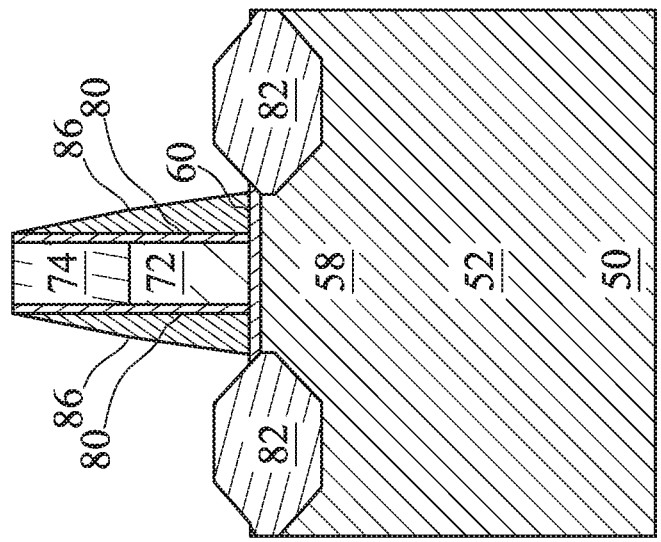
Figure 10A:
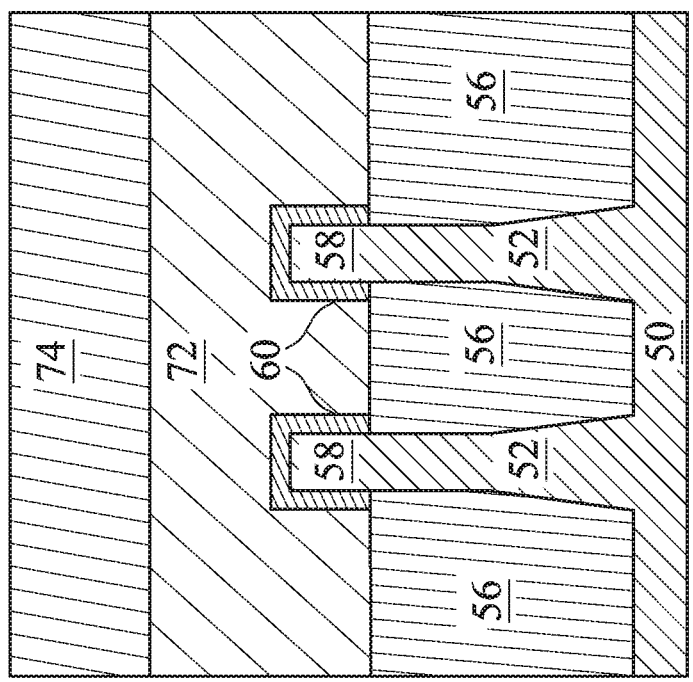
Figure 10C:
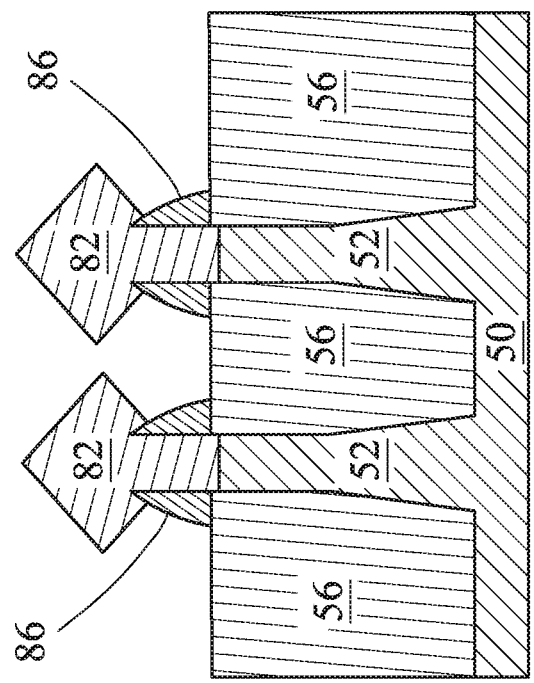
Figure 10D:
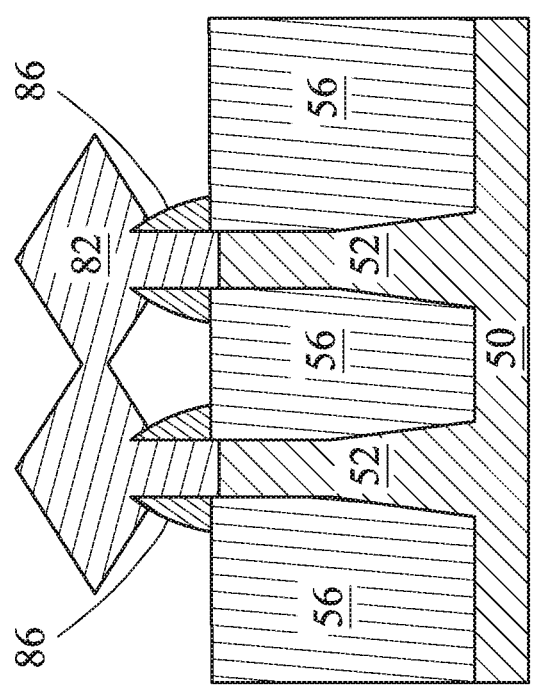

In FIGS. 10A and 10B, epitaxial source/drain regions 82 are formed in the fins 52 to exert stress in the respective channel regions 58, thereby improving device performance. The epitaxial source/drain regions 82 are formed in the fins 52 such that each dummy gate 72 is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFET device.

The epitaxial source/drain regions 82 in the region 50N may be formed by masking the region 50P and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, a combination thereof, or the like. The epitaxial source/drain regions 82 in the region 50N may have surfaces raised from respective surfaces of the fins 52 and may have facets.

The epitaxial source/drain regions 82 in the region 50P may be formed by masking the region 50N and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, a combination thereof, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions 82 may have an impurity concentration of between about $10^{19}$ cm$^{-3}$ and about $10^{21}$ cm$^{-3}$. The n-type and/or p-type impurities for source/drain regions 82 may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 10C. In other embodiments, adjacent epitaxial source/drain regions 82 remain separated after the epitaxy process is completed as illustrated by FIG. 10D. In the embodiments illustrated in FIGS. 10C and 10D, the gate spacers 86 are formed covering a portion of the sidewalls of the fins 52 that extend above the STI regions 56 thereby blocking the epitaxial growth. In other embodiments, the spacer etch used to form the gate spacers 86 may be adjusted to remove the spacer material from the sidewalls of the fins to allow the epitaxially grown region to extend to the surface of the STI region 56.

In FIGS. 11A and 11B, a first ILD 88 is deposited over the structure illustrated in FIGS. 10A and 10B. The first ILD 88 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be also used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, a combination thereof, or the like, having a different etch rate than the material of the overlying first ILD 88.

Figure 12B:
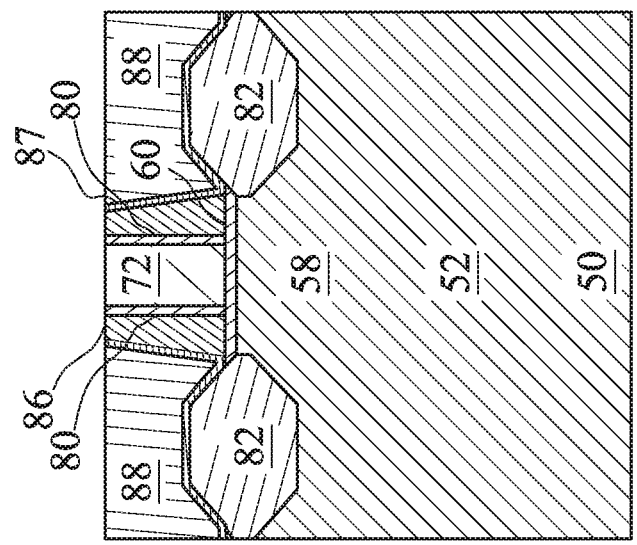
Figure 12A:
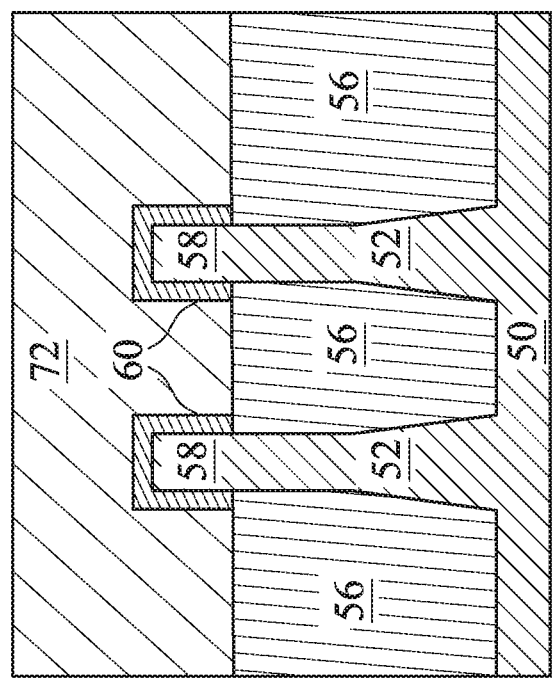

In FIGS. 12A and 12B, a planarization process, such as a CMP process, may be performed to level the top surface of the first ILD 88 with the top surfaces of the dummy gates 72 or the masks 74 (see FIGS. 11A and 11B). The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level with each other. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 13B:
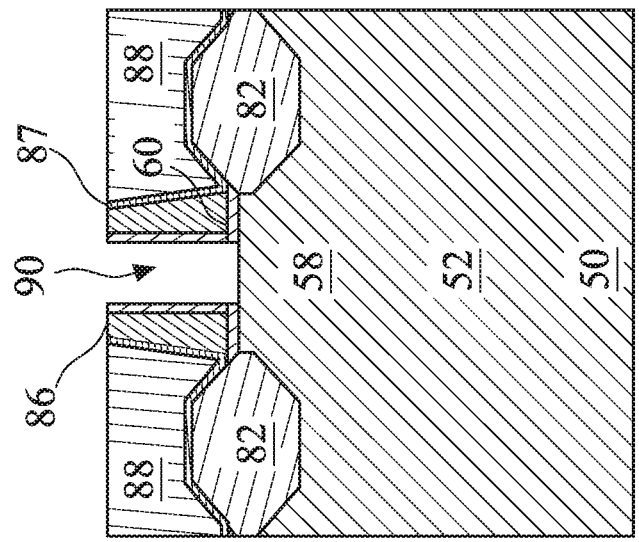
Figure 13A:
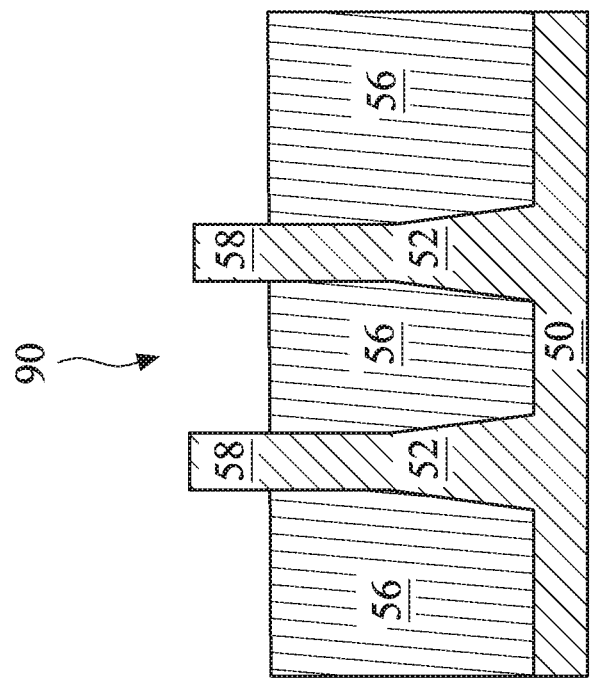

In FIGS. 13A and 13B, the dummy gates 72, and the masks 74, if present, are removed in an etching step(s), so that openings 90 are formed. Portions of the dummy dielectric layer 60 in the openings 90 may also be removed. In some embodiments, only the dummy gates 72 are removed and the dummy dielectric layer 60 remains and is exposed by the openings 90. In some embodiments, portions (illustrated by dashed lines in FIG. 16B) of the openings 90 extend below the top surfaces of the fins 52. In some embodiments, the dummy dielectric layer 60 is removed from the openings 90 in a first region of a die (e.g., a core logic region) and remains in openings 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each opening 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
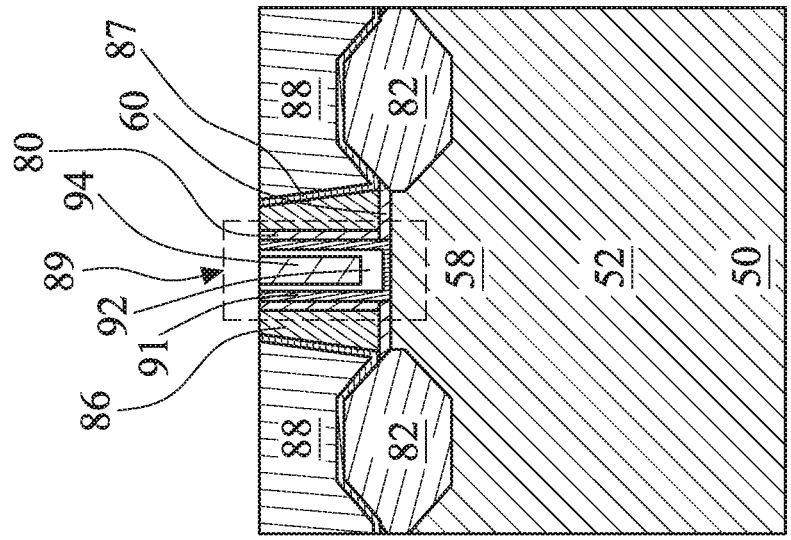
Figure 14A:
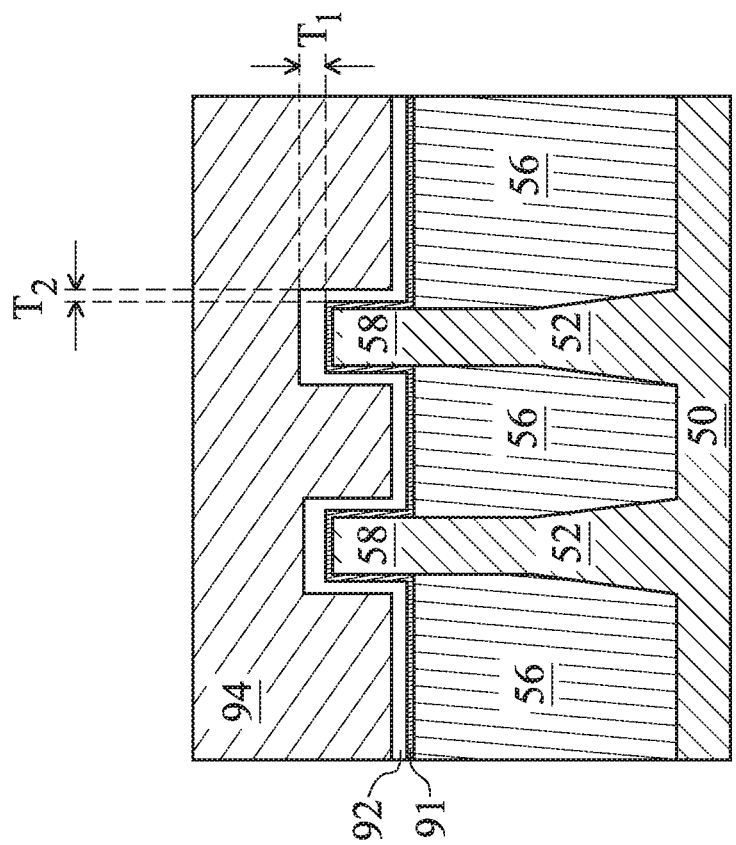
Figure 14C:
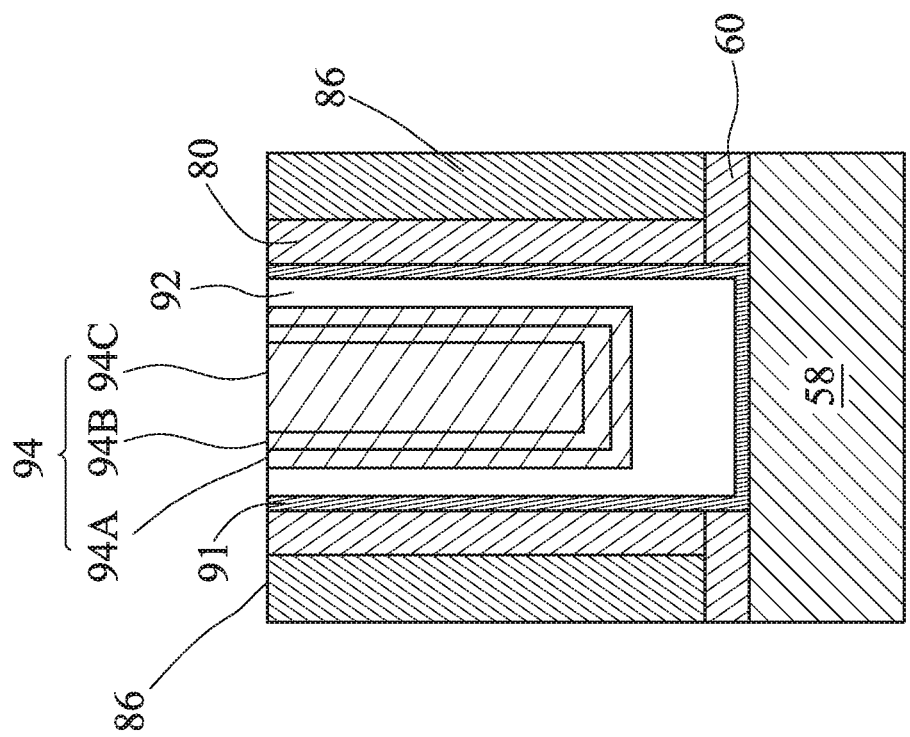

In FIGS. 14A and 14B, interfacial layers 91, gate dielectric layers 92 and gate electrodes 94 are formed for replacement gates. FIG. 14C illustrates a detailed view of region 89 of FIG. 14B. In some embodiments, interfacial layers 91 are formed in the openings 90 (see FIGS. 13A and 13B). The interfacial layers 91 may comprise silicon oxide and may be formed using a chemical deposition process, such as ALD, CVD, or the like, or using an oxidation process. In some embodiments where the interfacial layers 91 are formed using a deposition process, the interfacial layers 91 extend along exposed surfaces of the fins 52, the isolation regions 56, and spacers 80. In some embodiments where the interfacial layers 91 are formed using an oxidation process, the interfacial layers 91 extend along exposed surfaces of the fins 52, and do not extend along exposed surfaces of the isolation regions 56 and spacers 80. In some embodiments, the interfacial layers 91 have a thickness less than about 20 Å.

In some embodiments, gate dielectric layers 92 are non-conformally deposited over the interfacial layers 91 in the openings 90 (see FIGS. 13A and 13B), such that a thickness $T_1$ of the gate dielectric layers 92 over top surfaces of the fins 52 is greater than a thickness $T_2$ of the gate dielectric layers 92 on sidewalls of the fins 52. In some embodiments, the gate dielectric layers 92 may comprise silicon oxide, silicon nitride, or multilayers thereof, or the like. In some embodiments, the gate dielectric layers 92 may include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof, or the like. In some embodiments, the thickness $T_1$ is between about 10 Å and about 30 Å. In some embodiments, the thickness $T_2$ is between about 10 Å and about 30 Å. In some embodiments, a ratio of $T_1/T_2$ is between about 0.8 and about 1.2. In some embodiments, the gate dielectric layers 92 are formed by forming alternating conformal and non-conformal sub-layers as described below with reference to FIG. 25, and the detailed description is provided at that time. In other embodiments, the gate dielectric layers 92 are formed by forming one or more non-conformal sub-layers as described below with reference to FIG. 25, and the detailed description is provided at that time. In yet other embodiments, the gate dielectric layers 92 are formed using a method described below with reference to FIGS. 17A and 18-20, and the detailed description is provided at that time. In yet other embodiments, the gate dielectric layers 92 are formed using a method described below with reference to FIGS. 21A and 22, and the detailed description is provided at that time. In yet other embodiments, the gate dielectric layers 92 are formed using a method described below with reference to FIGS. 23A and 24, and the detailed description is provided at that time.

Further in FIGS. 14A and 14B, the gate electrodes 94 are deposited over the gate dielectric layers 92 and fill the remaining portions of the openings 90 (see FIGS. 13A and 13B). Although a single layer gate electrode 94 is illustrated in FIG. 14B, the gate electrode 94 may comprise any number of liner layers 94A, any number of work function tuning layers 94B, and a conductive fill layer 94C as illustrated by FIG. 14C. The liner layers 94A may include TiN, TiO, TaN, TaC, combinations thereof, multi-layers thereof, or the like, and may be formed using PVD, CVD, ALD, a combination thereof, or the like. In region 50N, the work function tuning layers 94B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In region 50P, the work function tuning layers 94B may include TiN, WN, TaN, Ru, Co, combinations thereof, multi-layers thereof, or the like, and may be formed using PVD, CVD, ALD, a combination thereof, or the like. In some embodiments, the conductive fill layer 94C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like.

After the filling of the openings 90 (see FIGS. 13A and 13B), a planarization process, such as a CMP, may be performed to remove the excess portions of the gate dielectric layers 92, the gate electrodes 94, and/or the interfacial layers 91, which excess portions are over the top surface of the ILD 88. The remaining portions of the gate electrodes 94, the gate dielectric layers 92, and the interfacial layers 91 thus form replacement gates of the resulting FinFETs. The gate electrodes 94, the gate dielectric layers 92, and the interfacial layers 91 may be collectively referred to as "gate stacks." The gate stacks may extend along sidewalls of channel regions 58 of the fins 52.

The formation of the gate dielectric layers 92 in the region 50N and the region 50P may occur simultaneously such that the gate dielectric layers 92 in each region are formed of the same materials. In other embodiments, the gate dielectric layers 92 in each region may be formed by distinct processes such that the gate dielectric layers 92 in different regions may be formed of different materials. The formation of the conductive fill layers 94C in the region 50N and the region 50P may occur simultaneously such that the conductive fill layers 94C in each region are formed of the same materials. In other embodiments, the conductive fill layers 94C in each region may be formed by distinct processes such that the conductive fill layers 94C in different regions may be formed of different materials. Various masking steps may be used to mask and expose appropriate regions when using distinct processes.

The formation of thicker gate dielectric layers 92 over the top surfaces of the fins 52 than on the sidewalls of the fins 52 allows for protecting the fins 52 from one or more etch processes performed on a FinFET device after forming the gate stacks 91/92/94 (including interfacial layers 91, corresponding overlying dielectric layers 92 and corresponding overlying gate electrodes 94) as described above with reference to FIGS. 14A, 14B and 14C. Accordingly, a yield and a reliability of the FinFET device may be improved. In some embodiments, the one or more etch processes may be a gate cut process, a gate patterning process, or the like.

Figure 15B:
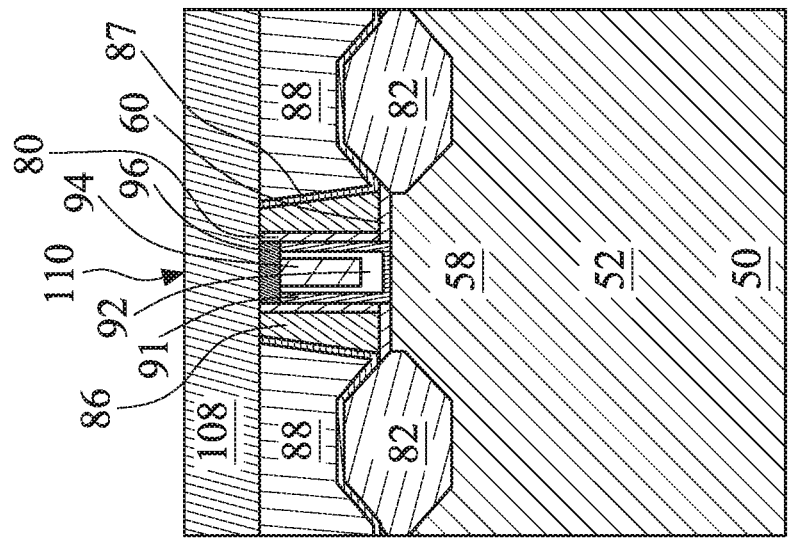
Figure 15A:
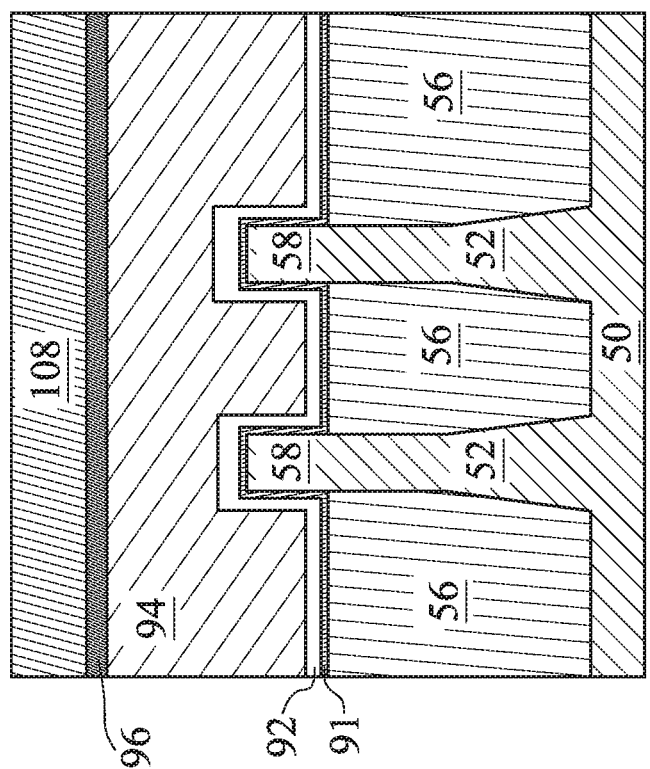

In FIGS. 15A and 15B, after performing the planarization process, a second ILD 108 is deposited over the first ILD 88 and the gate stacks 91/92/94 (including interfacial layers 91, corresponding overlying dielectric layers 92 and corresponding overlying gate electrodes 94). In some embodiment, the second ILD 108 is a flowable film formed by a flowable CVD method. In some embodiments, the second ILD 108 is formed of a dielectric material such as PSG, BSG, BPSG, USG, a combination thereof, or the like, and may be deposited by any suitable method, such as CVD, PECVD, a combination thereof, or the like. In some embodiments, the first ILD 88 and the second ILD 108 comprise a same material. In other embodiments, the first ILD 88 and the second ILD 108 comprise different materials.

In some embodiments, before the formation of the second ILD 108, the gate stacks 91/92/94 are recessed, so that recesses are formed directly over the gate stacks 91/92/94 and between opposing portions of gate spacers 86. Gate masks 96 comprising one or more layers of a dielectric material, such as silicon nitride, silicon oxynitride, a combination thereof, or the like, are filled in the recesses, followed by a planarization process to remove excess portions of the dielectric material extending over the first ILD 88. The subsequently formed gate contacts 110 (see FIGS. 16A and 16B) penetrate through the respective gate mask 96 to contact the top surface of the respective recessed gate electrode 94.

Figure 16B:
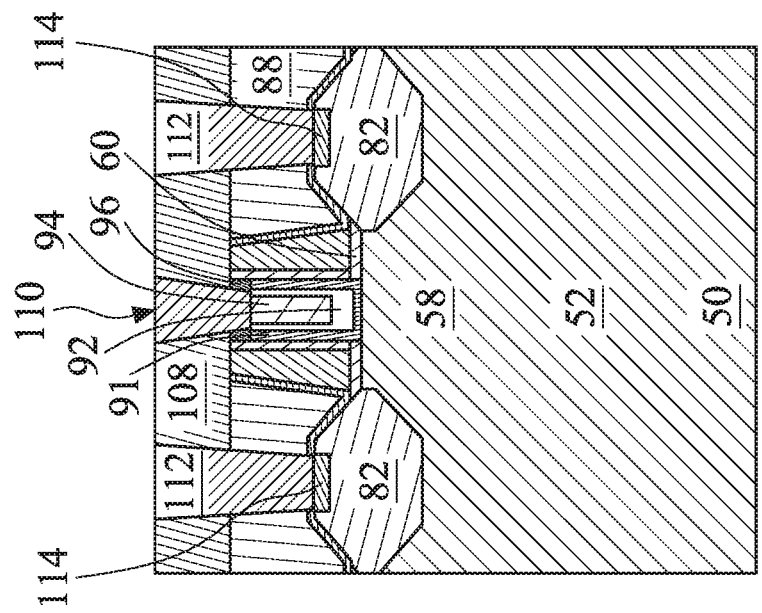
Figure 16A:
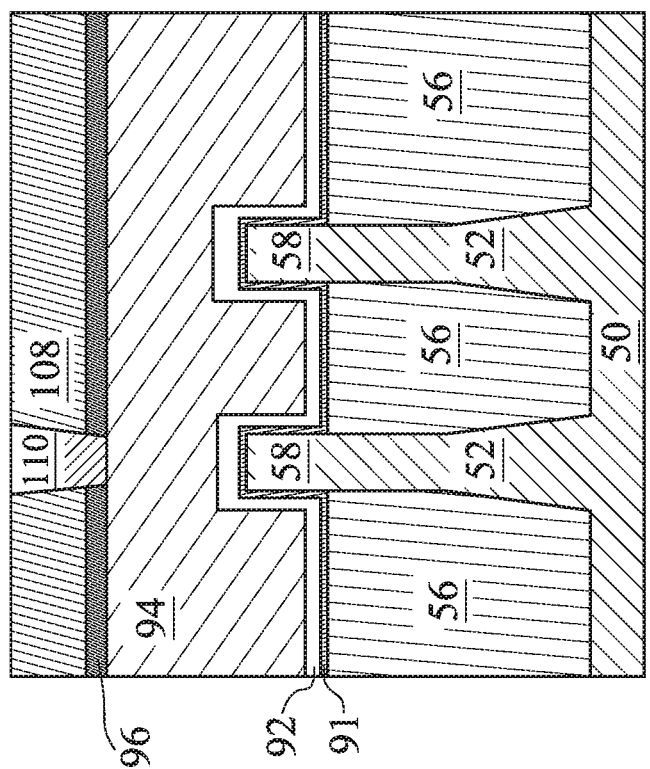

In FIGS. 16A and 16B, gate contacts 110 and source/drain contacts 112 are formed through the second ILD 108 and the first ILD 88 in accordance with some embodiments. Openings for the source/drain contacts 112 are formed through the first ILD 88 and the second ILD 108, and openings for the gate contacts 110 are formed through the second ILD 108 and the gate masks 96. The openings may be formed using acceptable photolithography and etching techniques. After forming the openings for the source/drain contacts 112, silicide layers 114 are formed through the openings for the source/drain contacts 112. In some embodiments, a metallic material is deposited in the openings for the source/drain contacts 112. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like.

Subsequently, an annealing process is performed to form the silicide layers 114. In some embodiments where the epitaxial source/drain regions 82 comprise silicon, the annealing process causes the metallic material to react with silicon to form a silicide of the metallic material at interfaces between the metallic material and the epitaxial source/drain regions 82. After forming the silicide layers 114, unreacted portions of the metallic material are removed using a suitable removal process, such as a suitable etch process, for example.

Subsequently, a liner, such as a diffusion barrier layer, an adhesion layer, or the like, and a conductive material are formed in the openings for the source/drain contacts 112 and in the openings for the gate contacts 110. The liner may include titanium, titanium nitride, tantalum, tantalum nitride, a combination thereof, or the like. The conductive material may include copper, a copper alloy, silver, gold, tungsten, cobalt, aluminum, nickel, a combination thereof, or the like. A planarization process, such as a CMP process, may be performed to remove excess material from a surface of the second ILD 108. The remaining portions of the liner and the conductive material form the source/drain contacts 112 and the gate contacts 110 in the openings. The source/drain contacts 112 are physically and electrically coupled to the respective epitaxial source/drain regions 82, and the gate contacts 110 are physically and electrically coupled to the respective gate electrodes 94. The source/drain contacts 112 and gate contacts 110 may be formed in different processes, or may be formed in the same process. Although shown as being formed in the same cross-sections, it should be appreciated that each of the source/drain contacts 112 and the gate contacts 110 may be formed in different cross-sections, which may avoid shorting of the contacts.

Figure 17A:
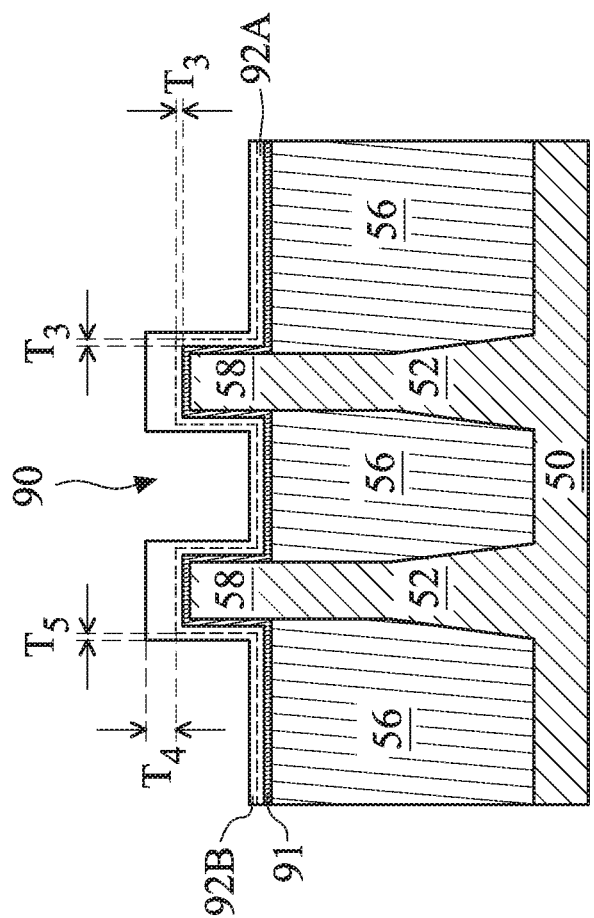
FIG. 17A is a cross-sectional view of intermediate stages in the manufacturing of a gate dielectric layer in accordance with some embodiments.
Figure 18:
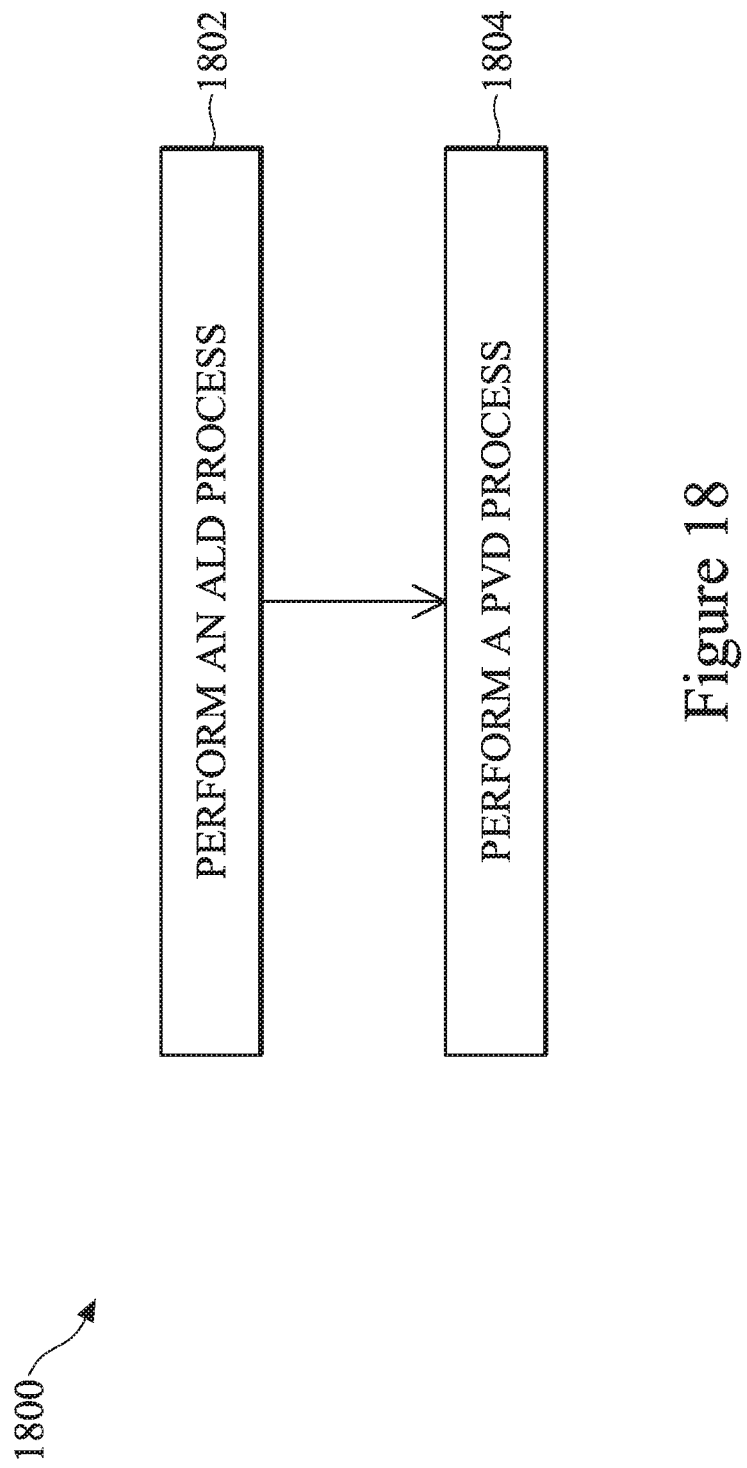
FIG. 18 is a flow diagram illustrating a method of forming a gate dielectric layer in accordance with some embodiments.
Figure 19:
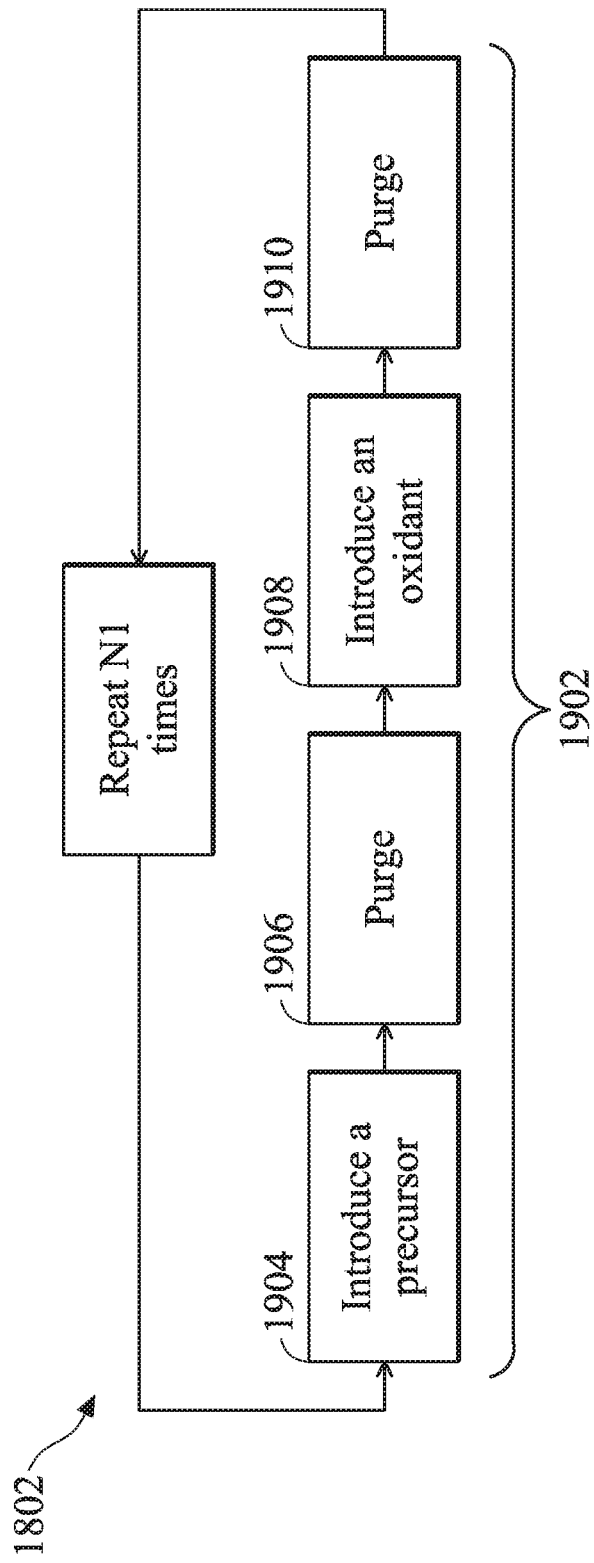
FIG. 19 is a flow diagram illustrating an atomic layer deposition process in accordance with some embodiments.

FIGS. 17A and 18-20 illustrate a formation of the gate dielectric layer 92 in accordance with some embodiments. FIG. 17A is a cross-sectional view of intermediate stages in the manufacturing of the gate dielectric layer 92 in accordance with some embodiments. FIG. 18 is a flow diagram illustrating a method 1800 of forming the gate dielectric layer 92 in accordance with some embodiments. FIG. 19 is a flow diagram illustrating an atomic layer deposition (ALD) process 1802 in accordance with some embodiments. FIG.

20 is a flow diagram illustrating a physical vapor deposition (PVD) process 1804 in accordance with some embodiments.

Referring to FIGS. 17A and 18, the gate dielectric layer 92 may be formed using a deposition process comprising a conformal deposition process, such as an ALD process 1802, followed by a non-conformal deposition process, such as a PVD process 1804. In some embodiments, by performing the ALD process 1802 first, a quality of an interface between the gate dielectric layer 92 and the fin 52 is improved. In other embodiments when the quality of the interface between the gate dielectric layer 92 and the fin 52 is less of a concern, the order of steps 1802 and 1804 may be reversed. In such embodiments, the PVD process 1804 may be performed first, followed by the ALD process 1802. In yet other embodiments, the ALD process 1802 may be omitted.

In some embodiments, the ALD process 1802 forms a first sublayer 92A of the gate dielectric layer 92. The first sublayer 92A is a substantially conformal layer and has a substantially same thickness $T_3$ over the top surface and the sidewalls of the fins 52 within process variations the ALD process 1802. In some embodiments, the thickness $T_3$ is between about 5 Å and about 20 Å.

Referring to FIGS. 17A and 19, the ALD process 1802 comprises performing an ALD cycle 1902 one or more times. In some embodiments, the ALD cycle 1902 is performed N1 times. In some embodiments, N1 may be between 1 and 50. In some embodiments, the ALD process 1802 is performed at a temperature between about 100° C. and about 500° C. In some embodiments, the ALD process 1802 may be performed at a pressure between about 0.1 Torr and about 10 Torr. In some embodiments, the ALD process 1802 may be performed for a time $t_1$ between about 1 min and about 10 min. In some embodiments, the ALD cycle 1902 may comprise performing a step 1904, where a precursor is introduced over the substrate 50. In some embodiments, the precursor is adsorbed on surfaces exposed by the opening 90. The precursor may comprise $ZrCl_4$, $HfCl_4$, TEMAHf, TMA, $TiCl_4$, $SiCl_4$, a combination thereof, or the like. In some embodiments, the precursor may be introduced for a time between about 0.2 sec and about 20 sec. In some embodiments, a pressure of a mixture of the precursor and a carrier gas (such as, for example, $N_2$ gas) within a gas line may be between about 100 Torr and about 200 Torr.

In step 1906, un-adsorbed portions of the precursor are purged using a non-reactive gas such as $N_2$, Ar, the like, and a combination thereof. In some embodiments, the purge is performed for a time between 0.1 sec and about 20 sec. In some embodiments, a flow rate of the non-reactive gas may be between about 50 sccm and about 900 sccm.

In step 1908, an oxidant is introduced over adsorbed portions of the precursor. The oxidant reacts with adsorbed portions of the precursor and forms a dielectric material of the first sublayer 92A of the gate dielectric layer 92. In some embodiments, the oxidant may comprise $H_2O$, $O_2$, the like, or a combination thereof. In some embodiments, the oxidant is introduced for a time between about 0.1 sec and about 20 sec. In some embodiments, a pressure of a mixture of the oxidant and a carrier gas (such as, for example, $N_2$ gas) within a gas line may be between about 50 Torr and about 150 Torr.

In step 1910, reaction by-products of step 1908 are purged using a non-reactive gas such as $N_2$, Ar, the like, and a combination thereof. In some embodiments, the purge is performed for a time between 0.1 sec and about 20 sec. In some embodiments, a flow rate of the non-reactive gas may be between about 50 sccm and about 900 sccm.

Referring further to FIGS. 17A and 18, after performing the ALD process 1802, the PVD process 1804 is performed.

In some embodiments, the PVD process 1804 forms a second sublayer 92B of the gate dielectric layer 92. In some embodiments, the PVD process 1804 may be performed at a temperature between about room temperature and about 100° C. In some embodiments, the PVD process 1804 may be performed at a pressure between about 1 mTorr and about 0.5 Torr. In some embodiments, the PVD process 1804 may be performed for a time $t_2$ between about 1 mins and about 10 mins. The second sublayer 92B is a non-conformal layer, such that a thickness $T_4$ of the second sublayer 92B over top surfaces of the fins 52 is greater than a thickness $T_5$ of the second sublayer 92B on the sidewalls of the fins 52. In some embodiments, the thickness $T_4$ is between about 2 Å and about 10 Å. In some embodiments, the thickness $T_5$ is between about 1 Å and about 6 Å. In some embodiments, a ratio of $T_4/T_5$ is between about 1.6 and about 2.5.

Figure 20:
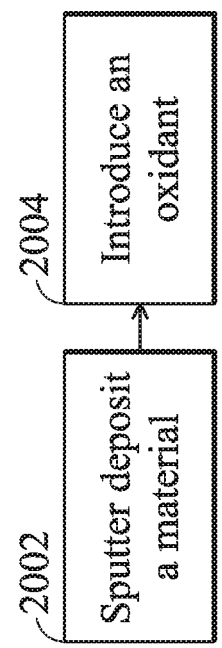
FIG. 20 is a flow diagram illustrating a physical vapor deposition process in accordance with some embodiments.

Referring to FIGS. 17A and 20, the PVD process 1804 comprises performing step 2002, where a desired material is sputter deposited on surfaces exposed by the opening 90. The desired material may comprise Zr, Hf, Ti, Al, Ta, Si, the like, or a combination thereof. In some embodiments, the precursor of the ALD process 1802 (see FIG. 19) and the sputter-deposited material of the PVD process 1804 may comprise a same chemical element. In other embodiments, the precursor of the ALD process 1802 (see FIG. 19) and the sputter-deposited material of the PVD process 1804 may comprise different chemical elements.

In some embodiments, non-conformal nature of the PVD process 1804 is due to non-conformal nature of the sputter deposition process. In some embodiments, a thickness of the sputter-deposited material over top surfaces of the fins 52 is greater than a thickness of the sputter-deposited material on the sidewalls of the fins 52. In some embodiments, the thickness of the sputter-deposited material over top surfaces of the fins 52 is between about 2 Å and about 10 Å. In some embodiments, the thickness of the sputter-deposited material on the sidewalls of the fins 52 is between about 1 Å and about 6 Å.

In step 2004, an oxidant is introduced over the sputter-deposited material. The oxidant reacts with the sputter-deposited material and forms a dielectric material of the second sublayer 92B of the gate dielectric layer 92. In some embodiments, the oxidant may comprise $H_2O$, $O_2$, the like, or a combination thereof. In some embodiments, the oxidant is introduced for a time between 10 sec and about 120 sec. In some embodiments, a flow rate of the oxidant is between about 1 sccm and about 100 sccm. In some embodiments, the first sublayer 92A and the second sublayer 92B may comprise a same material. In other embodiments, the first sublayer 92A and the second sublayer 92B may comprise different materials. In yet other embodiments, the first sublayer 92A and the second sublayer 92B may comprise same chemical elements with different compositions.

Referring further to FIGS. 14A, 17A, and 18, the time $t_2$ of the PVD process 1804 is different from the time $t_1$ of the ALD process 1802. In other embodiments, the time $t_2$ is same as the time $t_1$. In some embodiments, a ratio of $t_1/t_2$ is between about 0.1 and about 10. In some embodiments, the ratio of $T_1/T_2$ is tuned by changing the ratio of $t_1/t_2$. In some embodiments, the ratio of $t_1/t_2$ in a range between about 0.1 and about 10 corresponds to the ratio of $T_1/T_2$ in a range between about 0.8 and about 1.2. In some embodiments, the method 1800 allows the formation of the gate dielectric layer 92 with a large ratio of $T_1/T_2$.

Figure 21A:
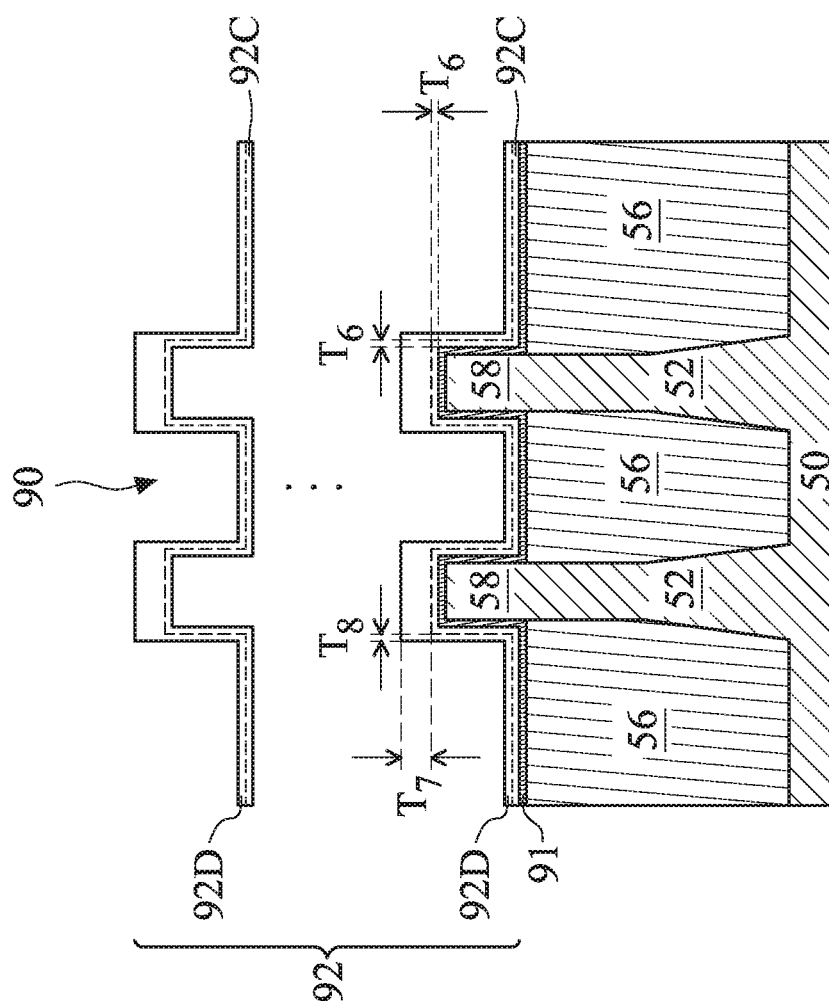
FIG. 21A is a cross-sectional view of intermediate stages in the manufacturing of a gate dielectric layer in accordance with some embodiments.
Figure 22:
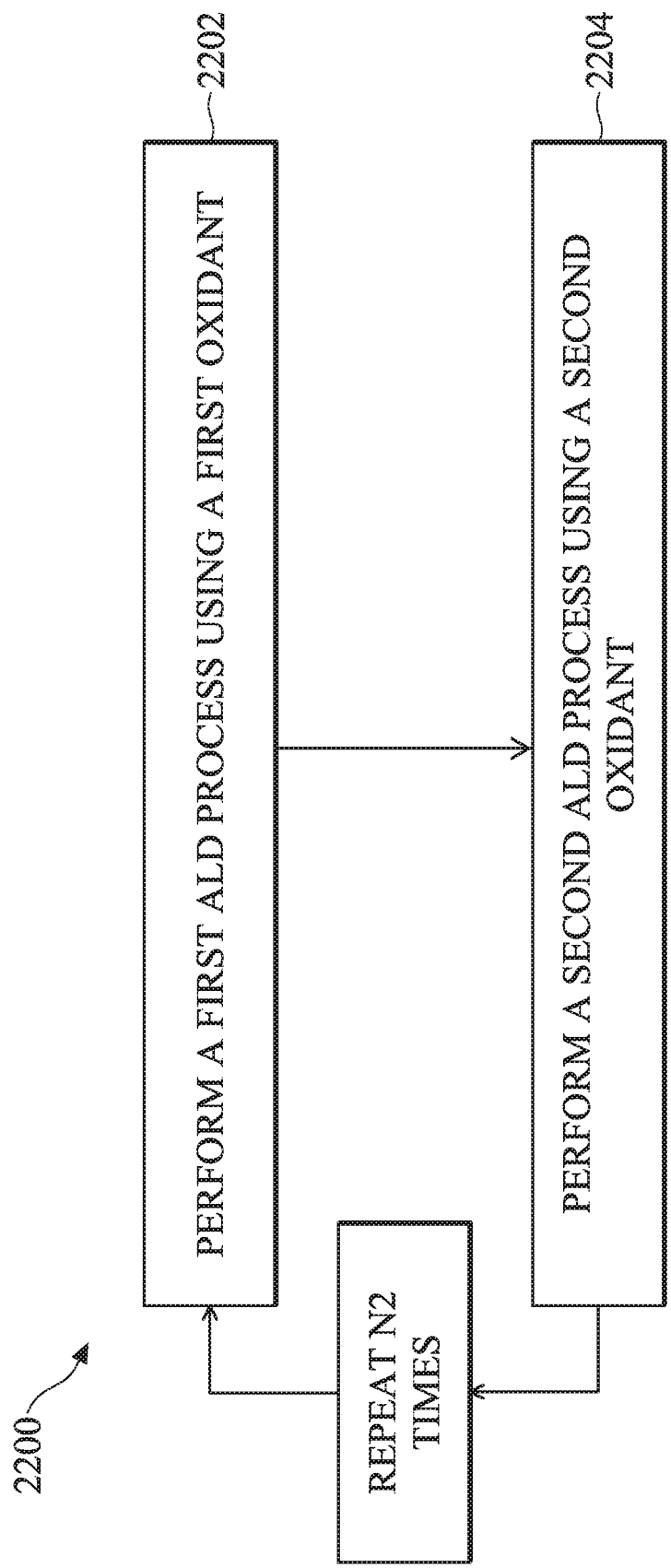
FIG. 22 is a flow diagram illustrating a method of forming a gate dielectric layer in accordance with some embodiments.

FIGS. 21A and 22 illustrate a formation of the gate dielectric layer 92 in accordance with some embodiments. FIG. 21A is a cross-sectional view of intermediate stages in the manufacturing of the gate dielectric layer 92 in accordance with some embodiments. FIG. 22 is a flow diagram illustrating a method 2200 of forming the gate dielectric layer 92 in accordance with some embodiments. In some embodiments, the gate dielectric layer 92 may be formed using a deposition process comprising a conformal deposition process, such as a first ALD process 2202 performed using a first oxidant, followed by a non-conformal deposition process, such as a second ALD process 2204 performed using a second oxidant different from the first oxidant.

In some embodiments, the first ALD process 2202 forms a first sublayer 92C and second ALD process 2204 forms a second sublayer 92D. In some embodiments, the first sublayer 92C and the second sublayer 92D may comprise a same material. In other embodiments, the first sublayer 92C and the second sublayer 92D may comprise different materials. In yet other embodiments, the first sublayer 92C and the second sublayer 92D may comprise same chemical elements with different compositions.

In some embodiments, the first sublayer 92C is a substantially conformal layer and has a substantially same thickness $T_6$ over the top surfaces and the sidewalls of the fins 52 within process variations the first ALD process 2202. In some embodiments, the thickness $T_6$ is between about 5 Å and about 20 Å.

In some embodiments, the second sublayer 92D is a non-conformal layer, such that a thickness $T_7$ of the second sublayer 92D over top surfaces of the fins 52 is greater than a thickness $T_8$ of the second sublayer 92D on the sidewalls of the fins 52. In some embodiments, the thickness $T_7$ is between about 2 Å and about 10 Å. In some embodiments, the thickness $T_8$ is between about 1 Å and about 6 Å. In some embodiments, a ratio of $T_7/T_8$ is between about 1.6 and about 2.5.

In some embodiments, the first ALD process 2202 and the second ALD process 2204 may be performed N2 times. In such embodiments, one or more pairs of sublayers 92C and 92D are formed over the fins 52. In some embodiments, N2 may be between about 5 and about 30. In some embodiments, the first ALD process 2202 is performed for a time $t_3$ between about 1 min and about 10 min. In some embodiments, the second ALD process 2204 is performed for a time $t_4$ between about 1 min and about 15 min. In some embodiments, a ratio of $t_3/t_4$ is between about 0.6 and about 1.

In some embodiments, the first ALD process 2202 is similar to the ALD process 1802 described above with reference to FIG. 19 and the description is not repeated herein. In some embodiments, the first ALD process 2202 comprises performing ALD cycles (such as the ALD cycle 1902 illustrated in FIG. 19) N3 times. In some embodiments, N3 is between about 5 and about 30. In some embodiments, the first ALD process 2202 is performed using a first oxidant, such as $H_2O$. By using $H_2O$ as an oxidant, the first ALD process 2202 performs a conformal deposition process.

In some embodiments, the second ALD process 2204 is similar to the ALD process 1802 described above with reference to FIG. 19 and the description is not repeated herein. In some embodiments, the second ALD process 2204 comprises performing ALD cycles (such as the ALD cycle 1902 illustrated in FIG. 19) N4 times. In some embodiments, N4 is different from N3. In other embodiments, N4 is equal to N3. In some embodiments, N4 is between about 5 and about 30. In some embodiments, the second ALD process 2204 is performed using a second oxidant, such as $O_3$. By using $O_3$ as an oxidant, the second ALD process 2204 performs a non-conformal deposition process. In some embodiments, an oxidation rate is greater over the top surfaces of the fins 52 than along the sidewalls of the fins 52 due to decomposition of $O_3$ as the second oxidant flows from the top surfaces of the fins 52 along the sidewalls of the fins 52 toward the substrate 50. In some embodiments, the first ALD process 2202 and the second ALD process 2204 may be performed using a same precursor. In other embodiments, the first ALD process 2202 and the second ALD process 2204 may be performed using different precursors.

Referring further to FIGS. 21A and 22, in some embodiments, by performing the first ALD process 2202 first, oxidation of the fins 52 may be reduced or avoided. In other embodiments when oxidation of the fins 52 is less of a concern, the order of steps 2202 and 2204 may be reversed. In such embodiments, the second ALD process 2204 is performed first, followed by the first ALD process 2202. In yet other embodiments, the first ALD process 2202 may be omitted. In some embodiments, the method 2200 allows for performing the first ALD process 2202 and the second ALD process 2204 in a same chamber without an air break between the first ALD process 2202 and the second ALD process 2204.

Figure 23A:
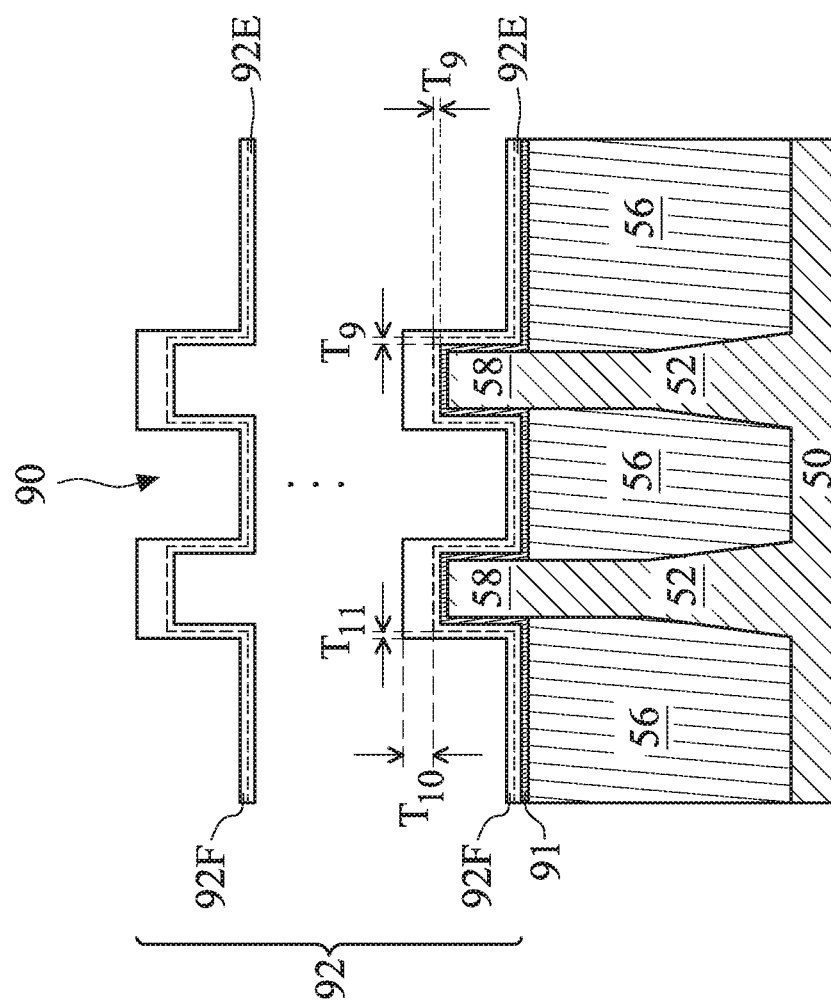
FIG. 23A is a cross-sectional view of intermediate stages in the manufacturing of a gate dielectric layer in accordance with some embodiments.
Figure 24:
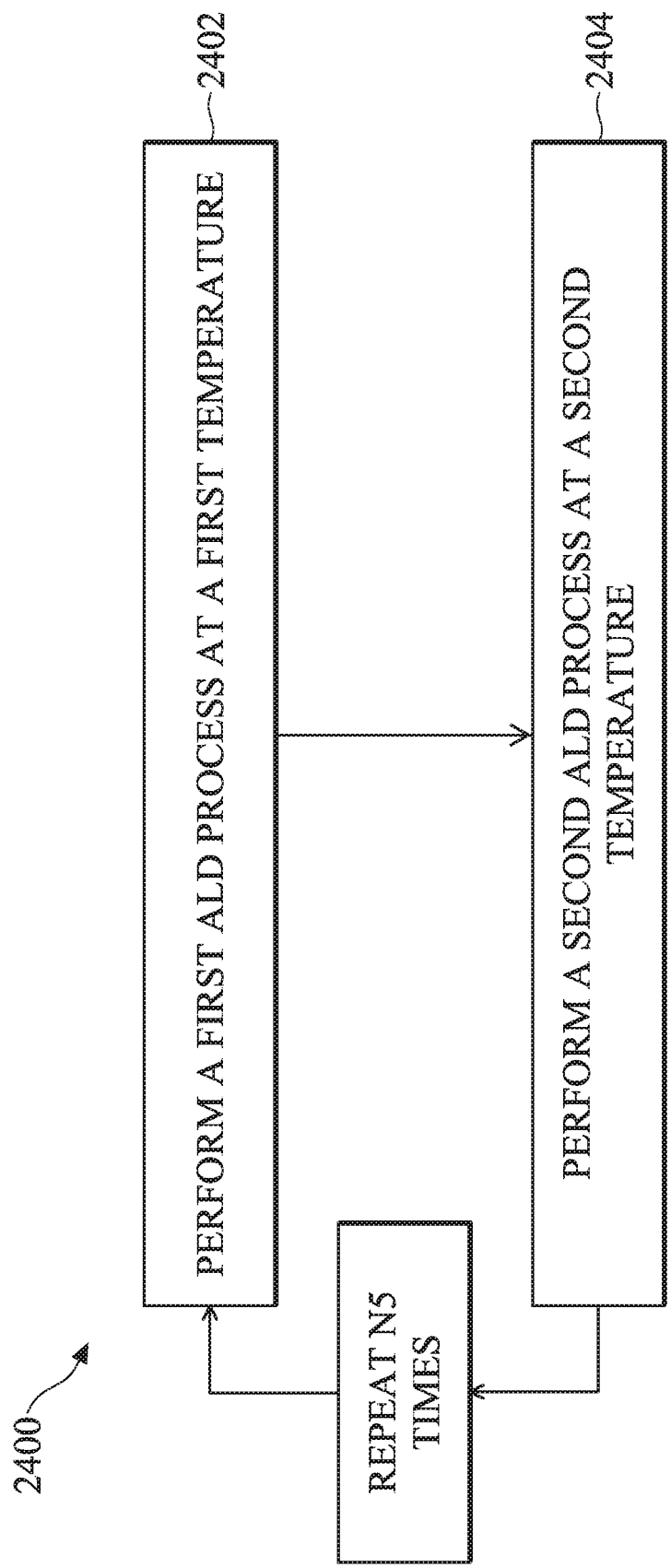
FIG. 24 is a flow diagram illustrating a method of forming a gate dielectric layer in accordance with some embodiments.

FIGS. 23A and 24 illustrate a formation of the gate dielectric layer 92 in accordance with some embodiments. FIG. 23A is a cross-sectional view of intermediate stages in the manufacturing of the gate dielectric layer 92 in accordance with some embodiments. FIG. 24 is a flow diagram illustrating a method 2400 of forming the gate dielectric layer 92 in accordance with some embodiments. In some embodiments, the gate dielectric layer 92 may be formed using a deposition process comprising a conformal deposition process, such as a first ALD process 2402 performed using a first process temperature, followed by a non-conformal deposition process, such as a second ALD process 2404 performed using a second process temperature greater than the first temperature.

In some embodiments, the first ALD process 2402 forms a first sublayer 92E and the second ALD process 2404 forms a second sublayer 92F. In some embodiments, the first sublayer 92E and the second sublayer 92F may comprise a same material. In other embodiments, the first sublayer 92E and the second sublayer 92F may comprise different materials. In yet other embodiments, the first sublayer 92E and the second sublayer 92F may comprise same chemical elements with different compositions.

In some embodiments, the first sublayer 92E is a substantially conformal layer and has a substantially same thickness $T_9$ over the top surfaces and the sidewalls of the fins 52 within process variations the first ALD process 2402. In some embodiments, the thickness $T_9$ is between about 5 Å and about 20 Å.

In some embodiments, the second sublayer 92F is a non-conformal layer, such that a thickness $T_{10}$ of the second sublayer 92F over top surfaces of the fins 52 is greater than a thickness $T_{11}$ of the second sublayer 92F on the sidewalls of the fins 52. In some embodiments, the thickness $T_{10}$ is between about 2 Å and about 10 Å. In some embodiments, the thickness $T_{11}$ is between about 1 Å and about 6 Å. In some embodiments, a ratio of $T_{10}/T_{11}$ is between about 1.6 and about 2.5.

In some embodiments, the first ALD process 2402 and the second ALD process 2404 may be performed N5 times. In such embodiments, one or more pairs of sublayers 92E and 92F are formed over the fins 52. In some embodiments, N5 may be between about 5 and about 30. In some embodiments, the first ALD process 2402 is performed for a time $t_5$ between about 1 min and about 10 min. In some embodiments, the second ALD process 2204 is performed for a time $t_6$ between about 1 min and about 15 min. In some embodiments, a ratio of $t_5/t_6$ is between about 0.6 and about 1.

In some embodiments, the first ALD process 2402 is similar to the ALD process 1802 described above with reference to FIG. 19 and the description is not repeated herein. In some embodiments, the first ALD process 2402 comprises performing ALD cycles (such as the ALD cycle 1902 illustrated in FIG. 19) N6 times. In some embodiments, N6 is between about 5 and about 30. In some embodiments, the first ALD process 2202 is performed at a low process temperature between about 100° C. and about 400° C. In some embodiments, due to the low process temperature, the first ALD process 2402 performs a conformal deposition process.

In some embodiments, the second ALD process 2404 is similar to the ALD process 1802 described above with reference to FIG. 19 and the description is not repeated herein. In some embodiments, the second ALD process 2404 comprises performing ALD cycles (such as the ALD cycle 1902 illustrated in FIG. 19) N7 times. In some embodiments, N7 is different from N6. In other embodiments, N7 is equal to N6. In some embodiments, N7 is between about 5 and about 30. In some embodiments, the second ALD process 2404 is performed at a high process temperature, such as between about 200° C. and about 500° C. In some embodiments, due to the high process temperature, the second ALD process 2404 performs a non-conformal deposition process. In some embodiments, the high process temperature causes the deposition process to be a non-conformal deposition process with a deposition rate being greater on the top surfaces of the fins 52 than on the sidewalls of the fins 52.

In some embodiments, the first ALD process 2402 and the second ALD process 2404 may be performed using a same precursor. In other embodiments, the first ALD process 2402 and the second ALD process 2404 may be performed using different precursors. In some embodiments, the first ALD process 2402 and the second ALD process 2404 may be performed using a same oxidant. In other embodiments, the first ALD process 2402 and the second ALD process 2404 may be performed using different oxidants.

Referring further to FIGS. 23A and 24, in the illustrated embodiment, the first ALD process 2402 is performed first, followed by the second ALD process 2404. In other embodiments, the order of steps 2402 and 2404 may be reversed. In such embodiments, the second ALD process 2404 is performed first, followed by the first ALD process 2402. In yet other embodiments, the first ALD process 2402 may be omitted. In some embodiments, the method 2400 allows for forming the first sublayers 92E and the second sublayers 92F comprising a same dielectric material having similar compositions.

Figure 25:
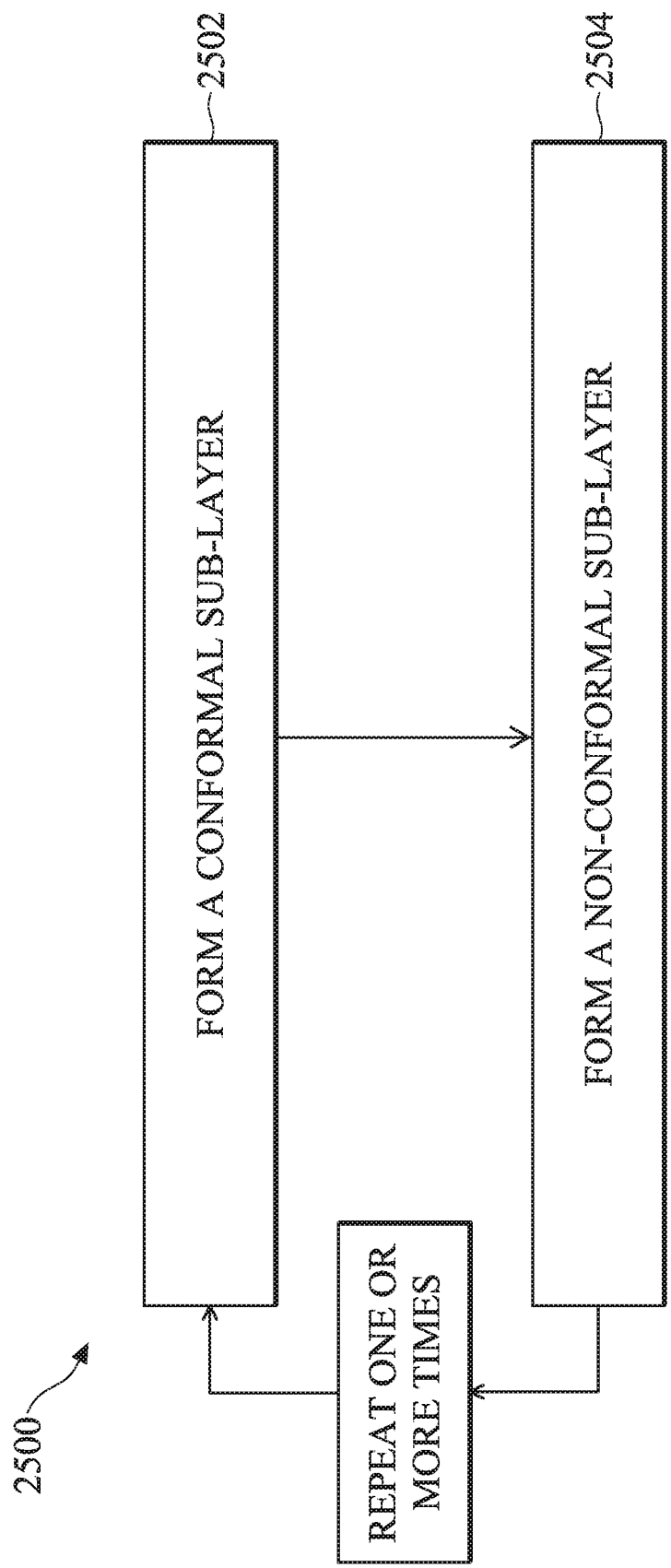
FIG. 25 is a flow diagram illustrating a method of forming a gate dielectric layer in accordance with some embodiments.

FIG. 25 is a flow diagram illustrating a method 2500 of forming a gate dielectric layer in accordance with some embodiments. The method 2500 starts with step 2502, where a conformal sub-layer is formed. In step 2504, a non-conformal sub-layer is formed. In some embodiments, steps 2502 and 2504 are repeated one or more times. In some embodiments, step 2504 is performed after step 2502. In other embodiments, step 2502 is performed after step 2504. In yet other embodiments, step 2502 is omitted. In some embodiments, step 2502 comprises performing step 1802 of the method 1800 and step 2504 comprises performing step 1804 of the method 1800 as described above with reference to FIG. 18. In other embodiments, step 2502 comprises performing step 2202 of the method 2200 and step 2504 comprises performing step 2204 of the method 2200 as described above with reference to FIG. 22. In yet other embodiments, step 2502 comprises performing step 2402 of the method 2400 and step 2504 comprises performing step 2404 of the method 2400 as described above with reference to FIG. 24.

Figure 26:
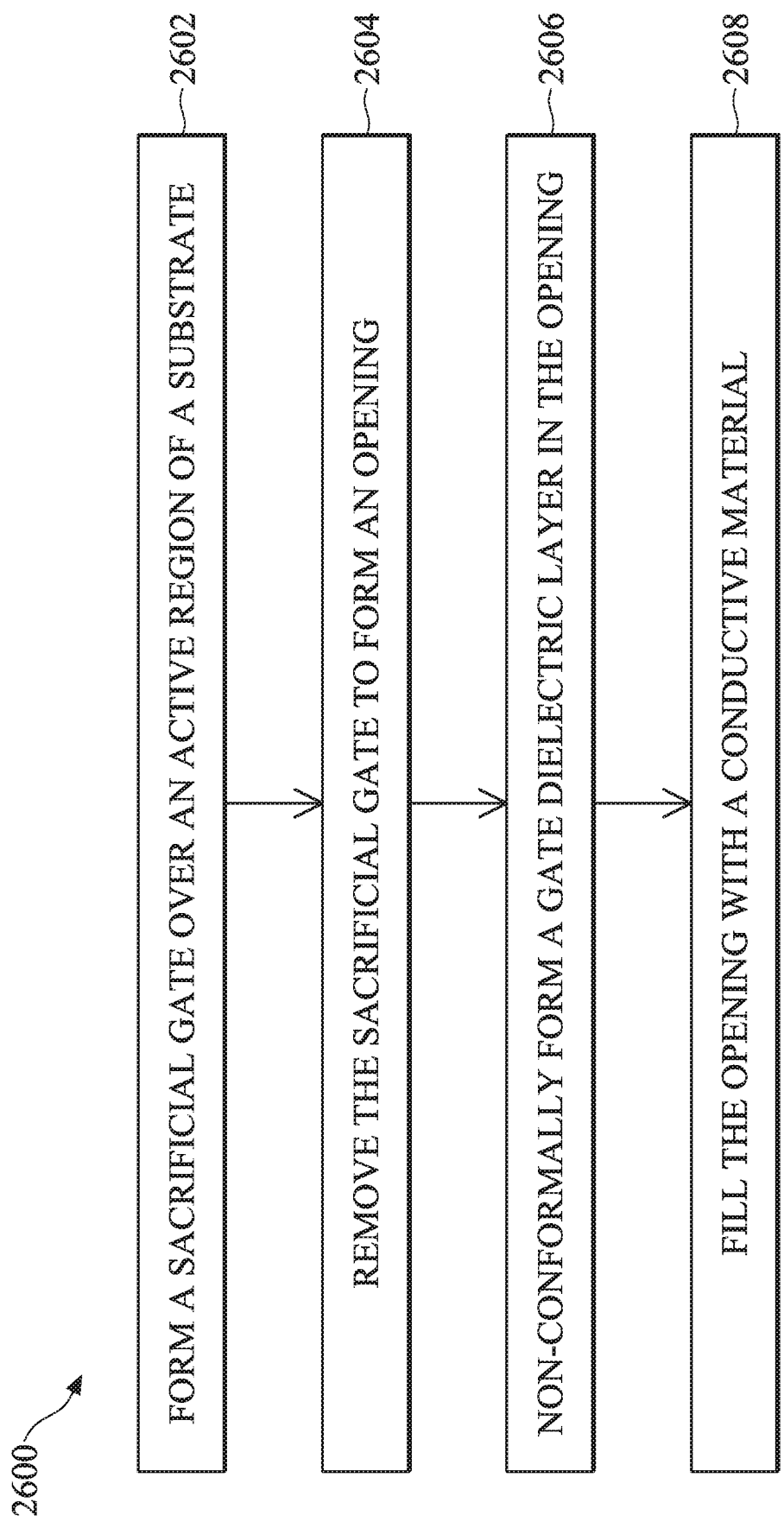
FIG. 26 is a flow diagram illustrating a method of forming a gate structure in accordance with some embodiments.

FIG. 26 is a flow diagram illustrating a method 2600 of forming a gate structure in accordance with some embodiments. The method 2600 starts with step 2602, where a sacrificial gate (such as the dummy gate 72 illustrated in FIGS. 8A and 8B) is formed over an active region (such as the fin 52 illustrated in FIGS. 8A and 8B) of a substrate (such as the substrate 50 illustrated in FIGS. 8A and 8B) as described above with reference to FIGS. 8A and 8B. In step 2604, the sacrificial gate is removed to form an opening (such as the opening 90 illustrated in FIGS. 13A and 13B) as described above with reference to FIGS. 13A and 13B. In step 2606, a gate dielectric layer (such as the gate dielectric layer 92 illustrated in FIGS. 14A and 14B) is non-conformally formed in the opening as described above with reference to FIGS. 14A and 14B. In step 2608, the opening is filled with a conductive material (such as the gate electrode 94 illustrated in FIGS. 14A and 14B) as described above with reference to FIGS. 14A and 14B. In some embodiments, the step 2606 is performed as described above with reference to FIGS. 17A and 18-20. In other embodiments, the step 2606 is performed as described above with reference to FIGS. 21A and 22. In yet other embodiments, the step 2606 is performed as described above with reference to FIGS. 23A and 24. In yet other embodiments, the step 2606 is performed as described above with reference to FIG. 25.

In accordance with an embodiment, a method includes: forming a fin extending from a substrate; and forming a gate dielectric layer along a top surface and sidewalls of the fin, wherein a first thickness of the gate dielectric layer along the top surface of the fin is greater than a second thickness of the gate dielectric layer along the sidewalls of the fin, and wherein forming the gate dielectric layer includes: forming a conformal sublayer on the top surface and the sidewalls of the fin; and forming a non-conformal sublayer over the conformal sublayer. In an embodiment, forming the conformal sublayer includes performing a first atomic layer deposition (ALD) process on the top surface and the sidewalls of the fin. In an embodiment, forming the non-conformal sublayer includes performing a physical vapor deposition (PVD) process on the conformal sublayer. In an embodiment, the first ALD process is performed for a first time, and the PVD process is performed for a second time different from the first time. In an embodiment, forming the non-conformal sublayer includes performing a second ALD process on the conformal sublayer, the second ALD process being different from the first ALD process. In an embodiment, the first ALD process is performed using a first oxidant, and the second ALD process is performed using a second oxidant different from the first oxidant. In an embodiment, the first ALD process is performed at a first process temperature, and the second ALD process is performed at a second process temperature greater than the first process temperature. In an embodiment, the conformal sublayer and the non-conformal sublayer comprise different materials.

In accordance with another embodiment, a method includes: forming a fin extending from a substrate; forming a sacrificial layer along a top surface and sidewalls of the fin; removing the sacrificial layer to form an opening, the opening exposing the fin; and forming a gate dielectric layer along the top surface and the sidewalls of the fin, wherein a first thickness of the gate dielectric layer along the top surface of the fin is greater than a second thickness of the gate dielectric layer along the sidewalls of the fin, and wherein forming the gate dielectric layer includes: performing a conformal deposition process on the top surface and the sidewalls of the fin; and performing a non-conformal deposition process on the top surface and the sidewalls of the fin. In an embodiment, performing the conformal deposition process includes performing a first atomic layer deposition (ALD) process using a first oxidant, and performing the non-conformal deposition process includes performing a second ALD process using a second oxidant different from the first oxidant. In an embodiment, the first oxidant includes $H_2O$, and wherein the second oxidant includes $O_3$. In an embodiment, the first ALD process and the second ALD process are performed using different precursors. In an embodiment, performing the conformal deposition process includes performing a first ALD process at a first process temperature, and performing the non-conformal deposition process includes performing a second ALD process at a second process temperature greater than the first process temperature. In an embodiment, performing the conformal deposition process includes performing an ALD process, and performing the non-conformal deposition process includes performing a physical vapor deposition (PVD) process. In an embodiment, a precursor of the ALD process and a sputter-deposited material of the PVD process include a same chemical element. In an embodiment, the method further includes, before forming the gate dielectric layer, forming an interfacial layer along the top surface and the sidewalls of the fin.

In accordance with yet another embodiment, a device includes a fin extending from a substrate and an isolation structure over the substrate and adjacent the fin. A top surface of the fin is above a top surface of the isolation structure. The device further includes a gate dielectric layer along the top surface and sidewalls of the fin and the top surface of the isolation structure, and a gate electrode layer over the gate dielectric layer. A first thickness of the gate dielectric layer along the top surface of the fin is greater than a second thickness of the gate dielectric layer along the sidewalls of the fin. In an embodiment, a ratio of the first thickness to the second thickness is greater than 1 and less than about 1.2. In an embodiment, the device further includes an interfacial layer between the fin and the gate dielectric layer. In an embodiment, the gate dielectric layer includes a conformal sublayer comprising a first material and a non-conformal sublayer over the conformal sublayer. The non-conformal sublayer includes a second material different from the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a fin extending from a substrate;
   forming a sacrificial layer along a top surface and sidewalls of the fin;
   removing the sacrificial layer to form an opening, the opening exposing the fin; and
   forming a gate dielectric layer along the top surface and the sidewalls of the fin, wherein a first thickness of the gate dielectric layer along the top surface of the fin is greater than a second thickness of the gate dielectric layer along the sidewalls of the fin, and wherein forming the gate dielectric layer comprises:
      implementing a cycle of:
         performing a conformal deposition process on the top surface and the sidewalls of the fin; and
         after the conformal deposition process, performing a non-conformal deposition process on the top surface and the sidewalls of the fin; and
      repeating the cycle one or more times.

2. The method of claim 1, wherein performing the conformal deposition process comprises performing a first ALD process at a first process temperature, and wherein performing the non-conformal deposition process comprises performing a second ALD process at a second process temperature greater than the first process temperature.

3. The method of claim 1, further comprising, before forming the gate dielectric layer, forming an interfacial layer along the top surface and the sidewalls of the fin.

4. The method of claim 1, wherein performing the conformal deposition process comprises performing an ALD process, and wherein performing the non-conformal deposition process comprises performing a physical vapor deposition (PVD) process.

5. The method of claim 4, wherein a precursor of the ALD process and a sputter-deposited material of the PVD process comprise a same chemical element.

6. The method of claim 1, wherein performing the conformal deposition process comprises performing a first atomic layer deposition (ALD) process using a first oxidant, and wherein performing the non-conformal deposition process comprises performing a second ALD process using a second oxidant different from the first oxidant.

7. The method of claim 6, wherein the first oxidant comprises $H_2O$, and wherein the second oxidant comprises $O_3$.

8. The method of claim 6, wherein the first ALD process and the second ALD process are performed using different precursors.

9. A method comprising:
   forming a fin extending from a substrate;
   forming a first dielectric layer along a top surface and sidewalls of the fin;
   forming a dummy gate structure over the first dielectric layer;
   forming a second dielectric layer over the fin and adjacent the dummy gate structure;
   removing the dummy gate structure and a portion of the first dielectric layer to form an opening, the opening exposing the fin; and
   forming a gate dielectric layer in the opening over the fin, wherein the gate dielectric layer has a greater thickness on the top surface of the fin than on the sidewalls of the fin, and wherein forming the gate dielectric layer comprises:
      performing a cycle of:
         forming a first sub-layer on the top surface and the sidewalls of the fin; and
         after forming the first sub-layer, forming a second sub-layer on the first sub-layer on the top surface and the sidewalls of the fin, wherein the second sub-layer has a greater thickness than the first sub-layer on the top surface of the fin, wherein the second sub-layer has a greater thickness on the top surface of the fin than on the sidewalls of the fin; and repeating the cycle one or more times.

10. The method of claim 9, wherein the first sub-layer is a conformal sublayer that has a uniform thickness between about 5 Angstroms and 20 Angstroms over the top surface and the sidewalls of the fin.

11. The method of claim 9, wherein forming the first sub-layer comprises performing an atomic layer deposition (ALD) process.

12. The method of claim 11, wherein forming the second sub-layer comprises performing a physical vapor deposition (PVD) process.

13. The method of claim 12, wherein the first sub-layer and the second sub-layer comprises a same material.

14. A method comprising:
forming a fin extending from a substrate; and
forming a gate dielectric layer along a top surface and sidewalls of the fin, wherein a first thickness of the gate dielectric layer along the top surface of the fin is greater than a second thickness of the gate dielectric layer along the sidewalls of the fin, and wherein forming the gate dielectric layer comprises:
performing a cycle of:
forming a conformal sublayer on the top surface and the sidewalls of the fin; and
forming a non-conformal sublayer over the conformal sublayer; and
repeating the cycle one or more times.

15. The method of claim 14, wherein a ratio of a thickness of the non-conformal sublayer on the top surface of the fin to a thickness of the non-conformal sublayer on the sidewalls of the fin is between about 1.6 and about 2.5.

16. The method of claim 14, wherein forming the conformal sublayer comprises performing a first atomic layer deposition (ALD) process on the top surface and the sidewalls of the fin.

17. The method of claim 16, wherein forming the non-conformal sublayer comprises performing a physical vapor deposition (PVD) process on the conformal sublayer.

18. The method of claim 17, wherein the first ALD process is performed for a first time, and wherein the PVD process is performed for a second time different from the first time.

19. The method of claim 16, wherein forming the non-conformal sublayer comprises performing a second ALD process on the conformal sublayer, the second ALD process being different from the first ALD process.

20. The method of claim 19, wherein the first ALD process is performed using a first oxidant, and wherein the second ALD process is performed using a second oxidant different from the first oxidant.

* * * * *